(12) United States Patent
Mann et al.

(10) Patent No.: US 9,442,012 B2
(45) Date of Patent: Sep. 13, 2016

(54) SYSTEMS AND METHODS FOR OVERHEAD IMAGING AND VIDEO

(75) Inventors: Julian M. Mann, Menlo Park, CA (US); Daniel Berkenstock, Palo Alto, CA (US); M. Dirk Robinson, Menlo Park, CA (US)

(73) Assignee: Skybox Imaging, Inc., Mountain View, CA (US)

( * ) Notice: Subject to any disclaimer, the term of this patent is extended or adjusted under 35 U.S.C. 154(b) by 1016 days.

(21) Appl. No.: 13/454,756

(22) Filed: Apr. 24, 2012

(65) Prior Publication Data

US 2012/0293669 A1 Nov. 22, 2012

Related U.S. Application Data

(60) Provisional application No. 61/478,871, filed on Apr. 25, 2011, provisional application No. 61/565,345, filed on Nov. 30, 2011.

(51) Int. Cl.
| | |
|---|---|
| H04N 7/18 | (2006.01) |
| G01J 3/28 | (2006.01) |
| G01C 11/02 | (2006.01) |
| G01J 3/51 | (2006.01) |

(Continued)

(52) U.S. Cl.
CPC .............. *G01J 3/2823* (2013.01); *G01C 11/02* (2013.01); *G01C 11/025* (2013.01); *G01J 3/36* (2013.01); *G01J 3/462* (2013.01); *G01J 3/513* (2013.01); *H01L 31/02162* (2013.01); *H04N 5/372* (2013.01); *G01J 2003/2826* (2013.01)

(58) Field of Classification Search
CPC ..................................................... G01C 11/02
USPC ............................................................ 348/144
See application file for complete search history.

(56) References Cited

U.S. PATENT DOCUMENTS

| | | | |
|---|---|---|---|
| 3,601,529 | A | 8/1971 | Dischert |
| 3,715,962 | A | 2/1973 | Yost |

(Continued)

FOREIGN PATENT DOCUMENTS

| | | |
|---|---|---|
| DE | 20 2009 003286 | 5/2009 |
| EP | 2 242 252 | 10/2010 |

(Continued)

OTHER PUBLICATIONS

Hardie, Russel; 'A Fast image Super-Resolution Algorithm Using an Adaptive Wiener Filter'; Dec. 12, 2007; IEEE Transactions on Image Processing; vol. 16 No. 12 pp. 2953-2964.*

(Continued)

*Primary Examiner* — Jeremaiah C Hallenbeck-Huber
(74) *Attorney, Agent, or Firm* — Dority & Manning, P.A.

(57) ABSTRACT

Examples of an imaging sensor include a two-dimensional staring sensor with spectral filter strips for multispectral overhead imaging. The sensor may also include a panchromatic sensor with block or strip filters. The sensor may be used to collect multispectral color image data at a sampling resolution from overhead imaging platforms such as airplanes or satellites. The sensor can be used to provide video images. If a panchromatic sensor is included, the sensor may be used to collect panchromatic image data. Examples of methods for processing the image date include using the panchromatic image data to perform multi-frame enhancement or panchromatic sharpening on spectral images to improve their quality and resolution.

11 Claims, 15 Drawing Sheets

(51) Int. Cl.

| | |
|---|---|
| H01L 31/0216 | (2014.01) |
| G01J 3/36 | (2006.01) |
| G01J 3/46 | (2006.01) |
| H04N 5/372 | (2011.01) |

(56) References Cited

U.S. PATENT DOCUMENTS

| | | | |
|---|---|---|---|
| 3,808,357 | A | 4/1974 | Nakagaki et al. |
| 4,163,247 | A | 7/1979 | Bock et al. |
| 4,214,264 | A | 7/1980 | Hayward et al. |
| 4,246,598 | A | 1/1981 | Bock et al. |
| 4,404,586 | A | 9/1983 | Tabei |
| 4,514,755 | A | 4/1985 | Tabei |
| 4,656,508 | A | 4/1987 | Yokota |
| 4,803,645 | A | 2/1989 | Ohtomo et al. |
| 4,823,186 | A | 4/1989 | Muramatsu |
| 4,951,136 | A | 8/1990 | Drescher et al. |
| 5,790,188 | A | 8/1998 | Sun |
| 5,883,584 | A | 3/1999 | Langemann et al. |
| 5,949,914 | A * | 9/1999 | Yuen ............................ 382/254 |
| 6,678,048 | B1 | 1/2004 | Rienstra et al. |
| 6,781,707 | B2 | 8/2004 | Peters et al. |
| 6,831,688 | B2 | 12/2004 | Lareau et al. |
| 7,019,777 | B2 | 3/2006 | Sun |
| 7,149,366 | B1 | 12/2006 | Sun |
| 7,167,280 | B2 | 1/2007 | Bogdanowicz et al. |
| 7,298,922 | B1 | 11/2007 | Lindgren et al. |
| 7,379,612 | B2 | 5/2008 | Milanfar et al. |
| 7,385,705 | B1 | 6/2008 | Hoctor et al. |
| 7,412,107 | B2 | 8/2008 | Milanfar et al. |
| 7,417,210 | B2 | 8/2008 | Ax et al. |
| 7,468,504 | B2 | 12/2008 | Halvis et al. |
| 7,477,802 | B2 | 1/2009 | Milanfar et al. |
| 7,602,997 | B2 | 10/2009 | Young |
| 7,733,961 | B2 | 6/2010 | O'Hara et al. |
| 7,769,229 | B2 | 8/2010 | O'Brien et al. |
| 7,769,241 | B2 | 8/2010 | Adams et al. |
| 7,781,716 | B2 | 8/2010 | Anderson et al. |
| 7,830,430 | B2 | 11/2010 | Adams et al. |
| 7,844,127 | B2 | 11/2010 | Adams et al. |
| 7,855,740 | B2 | 12/2010 | Hamilton et al. |
| 7,855,752 | B2 | 12/2010 | Baker et al. |
| 7,897,902 | B2 | 3/2011 | Katzir et al. |
| 7,936,949 | B2 | 5/2011 | Riley et al. |
| 7,940,282 | B2 | 5/2011 | Milanfar et al. |
| 7,991,226 | B2 | 8/2011 | Schultz et al. |
| 8,031,258 | B2 | 10/2011 | Enge et al. |
| 8,045,024 | B2 | 10/2011 | Kumar et al. |
| 8,068,153 | B2 | 11/2011 | Kumar et al. |
| 8,073,246 | B2 | 12/2011 | Adams et al. |
| 8,078,009 | B2 | 12/2011 | Riley et al. |
| 8,094,960 | B2 | 1/2012 | Riley et al. |
| 8,111,307 | B2 | 2/2012 | Deever et al. |
| 8,116,576 | B2 | 2/2012 | Kondo |
| 8,125,546 | B2 | 2/2012 | Adams et al. |
| 8,179,445 | B2 | 5/2012 | Hao |
| 8,194,296 | B2 | 6/2012 | Compton |
| 8,203,615 | B2 | 6/2012 | Wang et al. |
| 8,203,633 | B2 | 6/2012 | Adams et al. |
| 8,487,996 | B2 | 7/2013 | Mann et al. |
| 2002/0012071 | A1 | 1/2002 | Sun |
| 2003/0006364 | A1 | 1/2003 | Katzir et al. |
| 2003/0193589 | A1 | 10/2003 | Lareau et al. |
| 2007/0024879 | A1* | 2/2007 | Hamilton et al. .............. 358/1.9 |
| 2007/0210244 | A1 | 9/2007 | Halvis et al. |
| 2008/0024390 | A1 | 1/2008 | Baker et al. |
| 2008/0123997 | A1 | 5/2008 | Adams et al. |
| 2008/0240602 | A1 | 10/2008 | Adams et al. |
| 2008/0278775 | A1 | 11/2008 | Katzir et al. |
| 2009/0046182 | A1 | 2/2009 | Adams et al. |
| 2009/0046995 | A1* | 2/2009 | Kanumuri et al. ........... 386/114 |
| 2009/0087087 | A1 | 4/2009 | Palum et al. |
| 2009/0147112 | A1 | 6/2009 | Baldwin |
| 2009/0226114 | A1 | 9/2009 | Choi et al. |
| 2009/0256909 | A1 | 10/2009 | Nixon |
| 2010/0128137 | A1 | 5/2010 | Guidash |
| 2010/0149396 | A1 | 6/2010 | Summa et al. |
| 2010/0194901 | A1* | 8/2010 | van Hoorebeke et al. ............................ 348/218.1 |
| 2010/0232692 | A1 | 9/2010 | Kumar et al. |
| 2010/0302418 | A1 | 12/2010 | Adams et al. |
| 2010/0309347 | A1 | 12/2010 | Adams et al. |
| 2010/0328499 | A1 | 12/2010 | Sun |
| 2011/0052095 | A1 | 3/2011 | Deever |
| 2011/0115793 | A1 | 5/2011 | Grycewicz |
| 2011/0115954 | A1 | 5/2011 | Compton |
| 2011/0134224 | A1 | 6/2011 | McClatchie et al. |
| 2011/0187902 | A1 | 8/2011 | Adams et al. |
| 2011/0279702 | A1 | 11/2011 | Plowman et al. |
| 2012/0044328 | A1 | 2/2012 | Gere |
| 2012/0127331 | A1 | 5/2012 | Brycewicz |
| 2012/0154584 | A1* | 6/2012 | Omer et al. .................. 348/144 |
| 2012/0257047 | A1 | 10/2012 | Biesemans et al. |
| 2012/0300064 | A1 | 11/2012 | Mann et al. |
| 2013/0050488 | A1 | 2/2013 | Brouard et al. |

FOREIGN PATENT DOCUMENTS

| | | |
|---|---|---|
| EP | 2 778 635 | 9/2014 |
| WO | WO 00/55602 A1 | 9/2000 |
| WO | WO 2009/025825 | 2/2009 |
| WO | WO 2009/085305 | 7/2009 |
| WO | 2012/148919 A2 | 11/2012 |

OTHER PUBLICATIONS

Becker, S. et al., "Image Restoration for Resolution Improvement of Digital Aerial Images: A Comparison of Large Format Digital Cameras," Proceedings of the ISPRS Symposium, "From Sensors to Imagery," May 4-6, 2006, vol. 36, Part 1, Paris, France, in 6 pages.

Borel, C.C. et al., "Novel Methods for Panchromatic Sharpening of Multi/Hyper-Spectral Image Data," Proceedings of the Geoscience and Remote Sensing Symposium, 2009 IEEE International, IGARSS, Jul. 2009, pp. 757-760, vol. 4.

Capobianco, L. et al., "Kalman-Based Pan-Sharpening of Very High Resolution Multispectral Images," Proceedings of the 27th Symposium of EARSeL, "GeoInformation in Europe," Jun. 2007, pp. 481-488, Millpress, Netherlands.

Daneshvar, S. et al., "Multispectral and Panchromatic Images Fusion Based on Integrating Feedback Retina and HIS Model," Proceedings of the World Congress on Engineering, Jul. 6-8, 2011, vol. 2, London, UK, in 5 pages.

Digitalglobe, Inc., "DigitalGlobe Core Imagery Products Guide," Feb. 2012, in 38 pages.

Ehlers, M. "Urban Remote Sensing: New Developments and Trends," Proceedings of URS, Mar. 2005, pp. 14-16.

Farsiu, S. et al., "Advances and Challenges in Super-Resolution," International Journal of Imaging Systems and Technology, Aug. 2004, pp. 47-57, vol. 14, No. 2.

Farsiu, S. et al., "Robust Shift and Add Approach to Super-Resolution," Proceedings of the SPIE, Applications of Digital Image Processing XXVI, Aug. 2003, pp. 121-130, vol. 5203.

Farsiu, S. et al., "Fast and Robust Multiframe Super Resolution," IEEE Transactions on Image Processing, Oct. 2004, pp. 1327-1344, vol. 13, No. 10.

Fonseca, L. et al., "Image Fusion for Remote Sensing Applications ," in Image Fusion and Its Applications, ed. Zheng, Y., Jun. 24, 2011, pp. 153-178, InTech.

Garzelli, A. et al. "Pan-Sharpening of Multispectral Images: A Critical Review and Comparison," Proceedings of the IEEE International Geoscience and Remote Sensing Symposium, Sep. 2004, pp. 20-24, Anchorage, AK.

Garzelli, A. et al., "Panchromatic Sharpening of Remote Sensing Images Using a Multiscale Kalman Filter," Pattern Recognition, Dec. 2007, pp. 3568-3577, vol. 40, No. 12.

Garzelli, A. et al., "Optional MMSE Pan Sharpening of Very High Resolution Multispectral Images," IEEE Transactions on Geoscience and Remote Sensing, Jan. 2008, pp. 228-236, vol. 46, No. 1.

Hu, J. et al., "Fusion of Panchromatic and Multispectral Images Using Multiscale Dual Bilateral Filter," Proceedings of the 18th

(56) References Cited

OTHER PUBLICATIONS

IEEE International Conference on Image Processing, Sep. 2011, Changsha, China, in 4 pages.

Irons, J. et al., "The Next Landsat Satellite: The Landsat Data Continuity Mission," Remote Sensing of Environment, Jan. 1, 2012, in 11 pages.

Jin, X. et al., "An Integrated System for Automatic Road Mapping from High-Resolution Multi-Spectral Satellite Imagery by Information Fusion," Information Fusion, Dec. 2005, pp. 257-273, vol. 6, No. 4.

Kalman, A. et al., "MISC™—A Novel Approach to Low-Cost Imaging Satellites," Proceedings from the 22nd Annual AIAA/USU Conference on Small Satellites, Aug. 13, 2008, in 11 pages.

Khan, M.M. et al., "Indusion: Fusion of Multispectral and Panchromatic Images Using the Induction Scaling Technique," IEEE Geoscience and Remote Sensing Letters, Jan. 2008, pp. 98-102, vol. 5, No. 1.

Eastman Kodak Co., "Kodak KLI-4104 Image Sensor: Device Performance Specification," Revision 4.0, Oct. 27, 2003, in 37 pages.

Kramer, H.J., "Part B: Commercial Imaging Satellites," from Observation of the Earth and Its Environment, 4th ed., 2002, pp. 263-310, Springer-Verlag, Germany.

Lee, J. et al., "Fast Panchromatic Sharpening for High-Resolution Multi-spectral Images," Proceedings of the Geoscience and Remote Sensing Symposium, IGARSS 2008, IEEE International, Jul. 2008, pp. 77-80, vol. 5.

Li, Z. et al., "Color Transfer Based Remote Sensing Image Fusion Using Non-Separable Wavelet Frame Transform," Pattern Recognition Letters, Oct. 2005, pp. 2006-2014, vol. 26.

Mahyari, A.G. et al., "Panchromatic and Multispectral Image Fusion Based on Maximization of both Spectral and Spatial Similarities," IEEE Transactions on Geoscience and Remote Sensing, Jun. 2011, pp. 1976-1985, vol. 49, No. 6.

Metwalli, M.R. et al., "Sharpening Misrsat-1 Data Using Super-Resolution and HPF Fusion Methods," Proceedings of the 28th National Radio Science Conference, NRSC, National Telecommunication Institute, Apr. 26-28, 2011, Egypt, in 8 pages.

Pateraki, M. et al., "Adaptive Multi-Image Matching Algorithm for the Airborne Digital Sensor ADS40," Proceedings of the Asian Conference on GIS, GPS, Aerial Photography and Remote Sensing, "MapAsia 2002," Aug. 2002, Thailand, in 6 pages.

Pateraki, M. et al., "Analysis and Performance of the Adaptive Multi-Image Matching Algorithm for Airborne Digital Sensor ADS40," Proceedings of the ASRPS Annual Conference, May 2003, Anchorage, AK, in 11 pages.

Sandau, R., "Potential and Shortcoming of Small Satellite for Topographic Mapping," Proceedings from ISPRS Comm. I WG 6 Workshop, Feb. 14-16, 2006, Ankara, Turkey, in 7 pages.

Shah, V.P. et al., "An Efficient Pan-Sharpening Method via a Combined Adaptive PCA Approach and Contourlets," IEEE Transactions on Geoscience and Remote Sensing, May 2008, pp. 1323-1335, vol. 46, No. 5.

Shaw, G.A. et al., "Spectral Imaging for Remote Sensing," Lincoln Laboratory Journal, Nov. 1, 2003, vol. 14, No. 1, in 26 pages.

Yang, S. et al., "Fusion of Multispectral and Panchromatic Images Based on Support Value Transform and Adaptive Principal Component Analysis," Information Fusion, Jul. 2012, pp. 177-184, vol. 13.

Yuhendra, et al., "Spectral Quality Evaluation of Pixel-Fused Data for Improved Classification of Remote Sensing Images," Proceedings of the Geoscience and Remote Sensing Symposium, IGARSS, IEEE International, Jul. 25, 2011, pp. 483-486.

Zhao, H. et al., "Transformation from Hyperspectral Radiance Data to Data of Other Sensors Based on Spectral Superresolution," IEEE Transactions on Geoscience and Remote Sensing, Nov. 2011, pp. 3903-3912, vol. 48, No. 11.

Zhou, Z. et al., "Pan-Sharpening: A Fast Variational Fusion Approach," Science China Information Sciences, Mar. 2012, pp. 615-625, vol. 55, No. 3.

International Preliminary Report on Patentability for International Application No. PCT/US2012/034821, filed Apr. 24, 2012, 2011, mailed Oct. 29, 2013, in 12 pages.

Sung Cheol Park et al., *Super-Resolution Image Reconstruction: a Technical Overview*, IEEE Signal Processing Magazine, vol. 20, No. 3, May 2003, pp. 21-36.

Extended European Search Report in European Application No. EP 14 17 1864, dated Jul. 24, 2014 in 13 pages.

First Action Interview Pilot Program Pre-Interview Communication for U.S. Appl. No. 13/566,110, dated Dec. 18, 2012, in 10 pages.

Applicant-Initiated Interview Summary for U.S. Appl. No. 13/566,110, dated Jan. 14, 2013, in 4 pages.

Preliminary Amendment for U.S. Appl. No. 13/566,110, dated Jan. 24, 2013, in 8 pages.

International Search Report and Written Opinion, mailed Jan. 3, 2013 in related International application No. PCT/US2012/034821 in 20 pages.

Invitation to Pay Additional Fees in corresponding International Application No. PCT/US2012/034821, Aug. 3, 2012, 7 pages.

\* cited by examiner

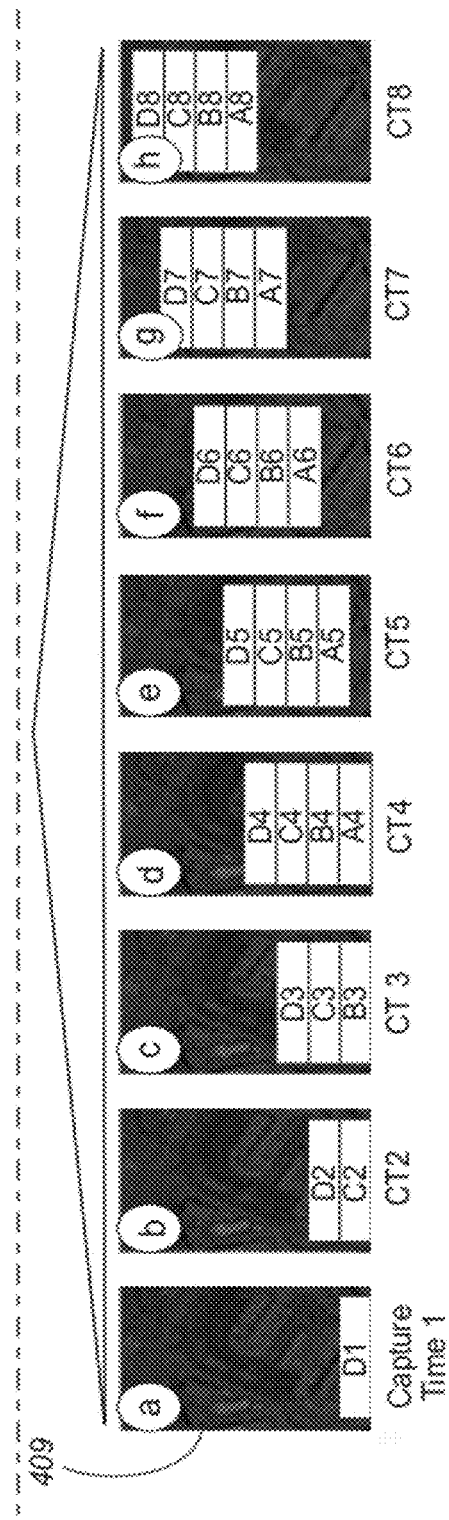
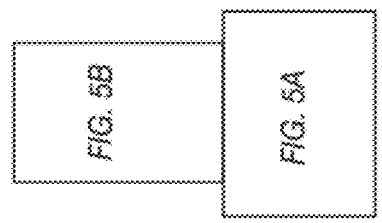
FIG. 5A
FIG. 5

SYSTEMS AND METHODS FOR OVERHEAD IMAGING AND VIDEO

CROSS-REFERENCE TO RELATED APPLICATIONS

This application claims the benefit of priority under 35 U.S.C. §119(e) to U.S. Provisional Patent Application No. 61/478,871, filed Apr. 25, 2011, entitled "Fast Framing Two-Dimensional Staring Sensor with Block Filters for Multispectral Overhead Push Frame Imaging," and U.S. Provisional Patent Application No. 61/565,345, filed Nov. 30, 2011, entitled "A Modified Push-Frame Image Sensor for Collection of Multispectral Imagery, High-Resolution Panchromatic Imagery, and Video;" both of the foregoing applications are expressly incorporated by reference herein in their entireties so as to form part of this specification.

BACKGROUND

1. Field

This disclosure generally relates to the field of imagery, and more specifically, to overhead imagery and video.

2. Description of the Related Art

The growth of the geo-spatial and geo-services industries has substantially increased the demand for overhead imagery. Traditional methodologies for collecting overhead imagery are extremely expensive, and the high cost prohibits the capture of images for many potential applications.

SUMMARY

Examples of apparatus, methods, and systems for efficient acquisition and processing of high-resolution panchromatic channels (and/or various combinations of high and low resolution multispectral channels) are disclosed herein. Some such example apparatus, methods, and systems can be used for video capture and panchromatic imaging. Using overlapped two-dimensional staring sensors with multiple redundancies in the panchromatic channel, multi-frame enhancement and panchromatic sharpening techniques can be used in various embodiments to provide high-resolution multispectral images without the costs, complexities, or limitations encountered with other sensor systems. Video can be provided from the panchromatic channel in some such embodiments.

In one aspect, a sensor for collecting image data for use in a moving imaging system is disclosed. The sensor comprises a spectral sensor configured to capture spectral image data. The spectral sensor can comprise an imaging surface area comprising an imaging width and a plurality of spectral filters. The spectral filters in aggregate can cover a spectral imaging portion of the imaging surface area of the spectral sensor. Each spectral filter can have a filter width at least substantially the same as the imaging width and a spectral filter height greater than or equal to a minimum filter height. The minimum filter height can equal a rate at which an image of a region of interest appears to move across the spectral sensor due to relative motion of the moving imaging system divided by a rate of frame capture of the spectral sensor. The sensor can comprise a controller configured to capture image data from the panchromatic sensor at a video frame rate and to provide the image data to a real-time video feed. The moving imaging system can be disposed in an overhead imaging platform such as, e.g., an airplane or an earth-orbiting satellite.

In another aspect, a method of enhancing image data is disclosed. The method can be performed under control of an imaging processing system comprising computing hardware. The method can comprise receiving a sequence of spectral image strips, where each spectral image strip comprises an image of a portion of a region of interest. Each spectral image strip can comprise image data from a spectral range of wavelengths of light. The method can further include registering the sequence of spectral image strips to provide a spectral image of the region of interest. The method can also include receiving a plurality of panchromatic images of the region of interest. Each panchromatic image can comprise image data from a panchromatic range of wavelengths of light that is broader than the spectral range of wavelengths of light. The method can include performing multi-frame enhancement on the plurality of panchromatic images to generate an enhanced panchromatic image having a higher resolution than each of the plurality of panchromatic images. In some aspects, the method can further include generating a panchromatic-sharpened spectral image using at least the enhanced panchromatic image and the spectral image, with the panchromatic-sharpened spectral image having a higher resolution than the spectral image.

In another aspect, a method of enhancing spectral image data is disclosed. The method can be under control of an imaging processing system comprising computing hardware. The method can include receiving a plurality of successive spectral images of portions of a region of interest, with each spectral image comprising a plurality of spectral image strips. Each spectral image strip can comprise image data from a different range of wavelengths of light. The method can include registering the spectral image strips from each range of wavelengths to create a plurality of reconstructed spectral images and combining the reconstructed spectral images to create a multispectral image. The method can also include converting the multispectral image into a color system comprising a luminance component to create a converted multispectral image, and replacing the luminance component of the converted multispectral image with a replacement spectral image based on the reconstructed spectral images to generate an enhanced spectral image.

The foregoing and other aspects will be described with reference to the figures and the following detailed description.

BRIEF DESCRIPTION OF THE DRAWINGS

FIGS. 5A and 5B are partial views that illustrate an example of an imaging sequence for capturing, registering, and combining an image using a two dimensional multispectral staring sensor with spectral filter strips, according to one embodiment. FIG. 5 is a view showing the whole imaging sequence formed by the partial views of FIGS. 5A and 5B and indicating the positions of the partial views.

The figures depict various embodiments of the present disclosure for purposes of illustration only and are not intended to be limiting. Alternative embodiments of the structures and methods illustrated herein may be employed without departing from the principles described herein. Reference will now be made in detail to several embodiments, examples of which are illustrated in the accompanying figures. It is noted that wherever practicable similar or like reference numbers may be used in the figures and may indicate similar or like functionality. Note that the relative dimensions of the figures may not be drawn to scale.

DETAILED DESCRIPTION

Overview

Some overhead imaging systems acquire images by having an imaging platform travel in a path over the region of interest called a track. The path may include one or more straight lines or segments or may be a curved path. The overhead imaging platform may be, for example, a satellite, an airplane, a helicopter, an unmanned aerial vehicle (UAV), a drone, a balloon, etc. The overhead imaging platform can be flown at a height over the region of interest. Image samples can be obtained continuously during the travel of the platform and can be assembled into an output image on the ground via digital processing. Some imaging systems are able to capture multispectral data. These imaging systems collect image samples over multiple spectral channels. There are several existing types of sensors that can be mounted to the imaging system to capture the image samples as the imaging platform travels along the track over the region of interest. These sensors include line scan sensors, time delay integration (TDI) sensors, two-dimensional (2D) staring sensors, color wheel type 2D staring sensors, and color filter array (CFA) sensors.

Figure 1:
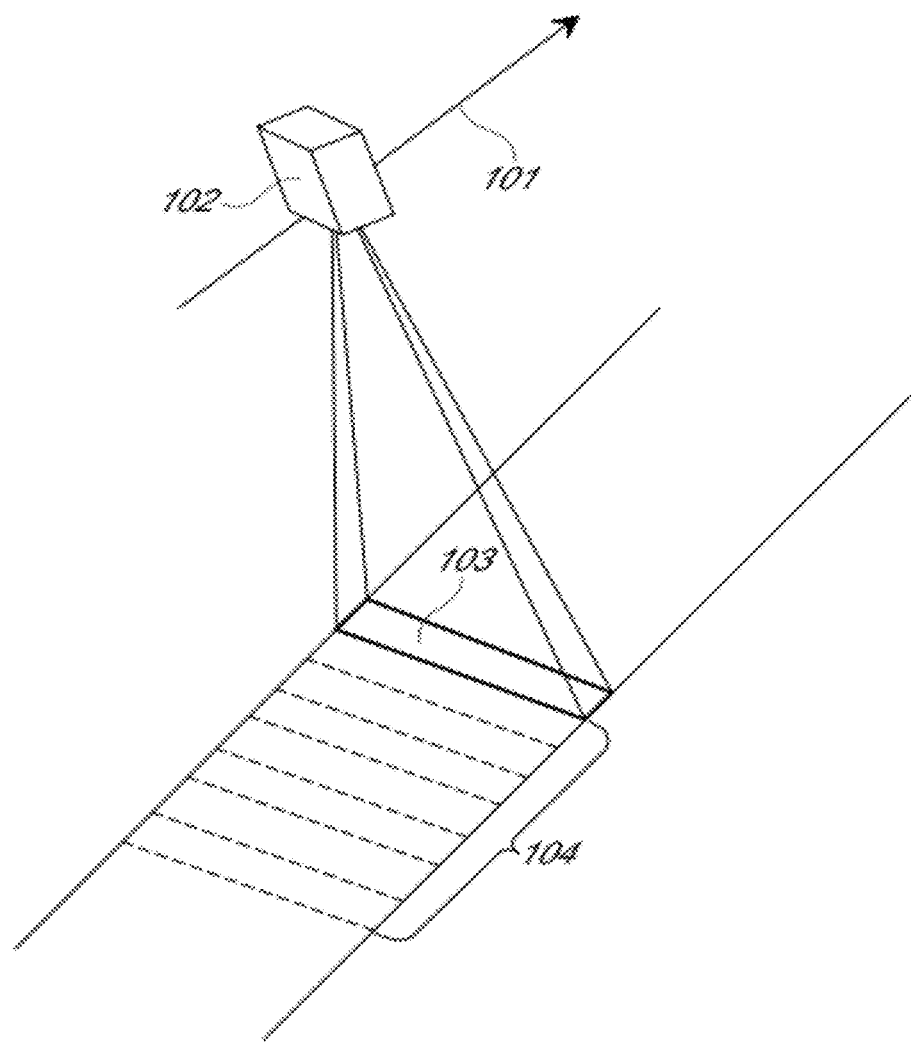
FIG. 1 illustrates an example of a one dimensional line sensor measurement scanned along a track direction, according to one embodiment.

FIG. 1 illustrates a one-dimensional line sensor measurement scanned along a track direction, according to one embodiment. A line scan sensor can be a sensor having a single row of pixels 103 for each color to be collected. The sensor is positioned in the platform so as to be perpendicular 102 to the track direction 101 thus moving in a linear manner across a scene. Each row of pixels in an image is exposed in sequence as the sensor moves across the scene, thus creating a complete 2D image 104. An overhead imaging platform that captures images with multispectral (e.g., multiple color) information may use an independent line scan sensor for each spectrum (e.g., color band) to be captured, wherein each line scan sensor is fitted with a different spectral filter (e.g., color filter).

A TDI sensor is a specific type of line scan sensor system where each spectrum band has several rows of pixels. Each column of pixels corresponds to a single point on the ground. As the sensor moves along the track, each column sweeps over the single point on the ground. Charge captured by the first pixel in the column is moved sequentially from row to row within that column. Thus, charge accumulates from pixel to pixel. The signal for a single point on the ground is read out in the last row of the column. This allows the light signal for each image to be integrated for a longer period of time, thereby improving the signal-to-noise (SNR) ratio for the image. As in the case of the line scan sensor above, an overhead imaging platform that captures images with multispectral information may use an independent TDI sensor for each spectrum to be captured, wherein each TDI sensor is fitted with a different spectral filter.

There are potential drawbacks to using line sensors or TDI sensors in an overhead imaging platform. In some implementations, these sensors require the imaging platform to be extremely stable and well-controlled during image collection to ensure that the relative motion of the imaged region is perpendicular to the one-dimensional image sensor. Any deviation of the orientation or relative speed of the imaged region during collection may result in irregular image sampling and therefore distortion in the collected images. This concern may be magnified in multispectral systems where stability should be maintained across the multiple line scan or TDI sensors.

Figure 2:
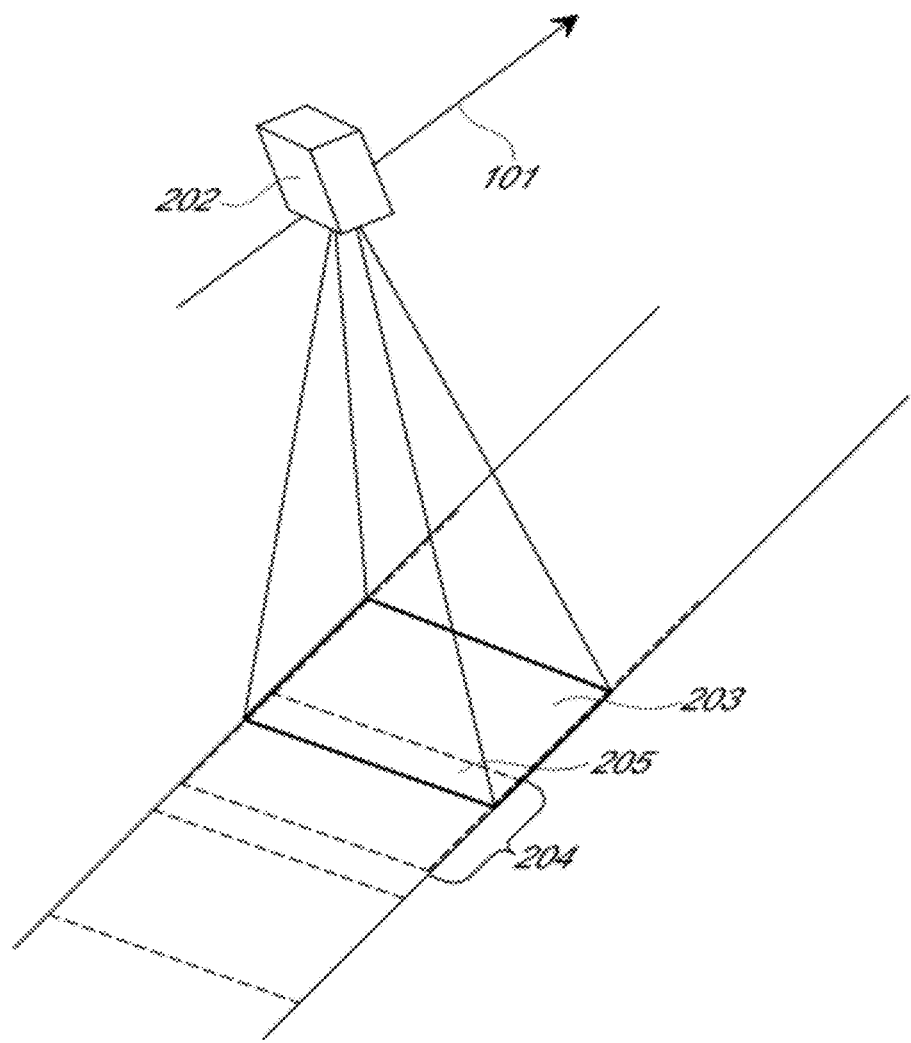
FIG. 2 illustrates an example of a two dimensional line staring sensor measurement scanned along the track direction, according to one embodiment.

Imaging systems using staring sensors acquire entire 2D frames taken as snapshots while the platform travels along the track as shown in FIG. 2. Staring sensor imaging systems can be designed such that neighboring images contain overlapping measurements of the region of interest. The presence of overlapping regions in the output images allows for later image processing to register neighboring image frames and mosaic the images together to reconstruct an image of the region of interest.

A color wheel sensor includes a mechanical addition to a 2D staring sensor. The staring sensor is set behind a mechanical wheel that contains a set of several different spectral filters. A region of interest is captured by exposing the staring sensor while rotating the color wheel through each of the spectral filters. By successively aligning the images exposed with each individual spectral filter, a complete color image of the region of interest can be created when the image is reconstructed during image processing.

There are potential drawbacks to using filter wheel staring sensors as part of an overhead imaging platform. Filter wheel systems are complex electro-mechanical systems that involve many fast moving parts that require accurate mechanical actuation to ensure that the filters are precisely oriented in front of the staring sensor. Further, precise time synchronicity may be implemented to ensure that the filter is correctly aligned when each successive image is captured. Filter wheel systems are further limited by the rate at which they can capture images, as moving spectral filters in and out of the imaging path takes time. Further, the mechanical nature of the filter wheel requires adding a significant amount of power and mass to the imaging system. Mechanical systems are also prone to failure over time. Combined, these factors increase both the cost and size of an overhead color wheel imaging system.

A color filter array (CFA), such as a Bayer filter, is the most common methodology for creating color images for consumer photographic digital cameras. An array of filters is placed over the 2D sensor. Each pixel has a different color filter, where the color filters repeat in a pattern similar to a checkerboard. An image is captured in one exposure, and a uniform color image is created using a process called color demosaicing. Color demosaicing is an interpolation process that formulates a full color image by approximating the distinct color value in each individual pixel. The pattern of the filters ensures that colored pixel measurements are co-registered to within a pixel of accuracy.

There are potential drawbacks to using CFA sensors as part of an overhead imaging platform. The fundamental patterned design of a CFA inherently lowers the resolution of the underlying staring sensor relative to a single spectrum image. If the CFA is used in conjunction with a staring sensor, mitigating this loss in resolution requires higher resolution staring sensors, both of which increase the cost of and power used by the overall system. In addition, while the CFA approach works well for photographic systems having only three color channels, very often the multispectral imaging systems used in overhead imaging system have five or more spectral channels. Incorporating five or more spectral channels into a CFA pattern further lowers the resolution of any output image, and requires irregular filter array patterns. Finally, overhead imaging platform systems used in space applications, unlike consumer photographic imaging systems, may require the use of interference filters to survive in a space environment. Manufacturing an array of interference filters on the scale of a CFA pixel dimension requires significant manufacturing cost.

Another existing type of sensor that collects multispectral data is a panchromatic channel (or panchromatic sensor). A panchromatic channel can have a broader spectral bandwidth than individual spectral channels. In some implementations, the panchromatic channel has a bandwidth that is as large as two, three, or more (e.g., all) of the spectral channels. Panchromatic channels can offer real-time video presentation and panchromatic sharpening. Panchromatic sharpening (pan-sharpening) is a technique by which the native resolution of a multispectral image is improved by combining it with comparably higher resolution panchromatic imagery. It can be costly to collect multispectral image data at the same resolution as panchromatic image data due to the lower signal-to-noise ratio of the spectral filters present in multispectral image sensors as compared to a panchromatic channel filter. Pan-sharpening can overcome this difficulty by combining higher resolution panchromatic image data with lower resolution multispectral image data. The panchromatic image data is higher resolution relative to the lower resolution of the multispectral image data.

Traditionally, pan-sharpened images are collected by using separate sensors for the panchromatic image data and the multispectral image data. The different sensors have different-size pixels, allowing multiple resolutions to be simultaneously collected through a single camera system.

However, using multiple sensors has several inherent disadvantages. Each additional sensor requires an additional suite of supporting electronics. This significantly increases the cost and complexity associated with the imaging system. For example, the additional electronics systems add weight and take space—highly valuable commodities in overhead imaging systems. Additionally, multiple sensor systems require additional power to operate. Finally, precise alignment of the multiple sensors must be achieved and preserved throughout the manufacture, assembly, deployment, and remainder of the lifecycle of the overhead imaging system.

Configuration Overview

Examples of a sensor that includes a fast framing two-dimensional staring sensor with spectral filter strips for multispectral overhead imaging are provided. The sensor may also include a panchromatic sensor arranged in a single block or in multiple strips. The sensor may be used to collect multispectral color image data. If a panchromatic sensor is included, the sensor may also be used to collect panchromatic image data. The panchromatic image data may be used to perform multi-frame enhancement and/or pan-sharpening on reconstructed spectral images to improve their quality. The sensor may be used to provide images and/or video. The sensor may be formed as a single monolithic (or unitary) sensor rather than as multiple individual sensors, e.g., the imaging portions of the sensor may be formed or mounted on a single, monolithic substrate.

In some embodiments, spectral filter strips can be disposed relative to the staring sensor, e.g., between the staring sensor and the region of interest to be imaged. The spectral filter strips may be attached to the staring sensor. In one embodiment, there are three or more spectral filter strips. The spectral filters strips can be arranged to cover the surface of the staring sensor, and can be oriented such that the long edges of the strips can be mounted in the imaging system so that they are perpendicular to the direction of travel of the imaging platform. Image processing can be used to reconstruct full multispectral images from the individual sub-images captured through the spectral filter strips.

The staring sensor and spectral filter strips allow multispectral image data to be collected at a fraction of the cost of traditional multispectral collection systems. The spectral filter strips allow the sensor to leverage the relaxed platform stabilities requirements of a 2D staring sensor with the spatial and temporal resolution of a line scan system. The use of a staring sensor reduces the precision and stability requirements of operating the sensor, at least in part because an entire multispectral image may be acquired in a single snapshot. For example, in some implementations, the image can be acquired in less than about 1 ms (e.g., 0.1 ms in some cases) so that stability requirements are much alleviated over sensors that require longer snapshot times (e.g., up to about 1 s for some sensors used in large satellites). Reducing the precision and/or stability requirements for a sensor may reduce the cost of building the sensor, as less infrastructure is needed to ensure that precision and/or stability is maintained. Small perturbations in the captured images due to changes in the position or speed of the sensor can be corrected for during image processing.

With the addition of a panchromatic sensor, the sensor can allow for efficient acquisition and processing of high-resolution panchromatic images. By capturing multiple at least partially redundant panchromatic images, multi-frame enhancement, and/or panchromatic sharpening may be performed to improve the quality of captured multispectral images, without the costs, complexities, or limitations encountered with other sensor systems. In some embodiments, the sensor includes a two dimension staring sensor with spectral filter strips, as well as a panchromatic sensor strip that is larger in the direction of travel by a factor than the individual spectral filter strips. The factor may be between one and four in some implementations, although the factor may be larger than four in other implementations.

In one embodiment, multispectral and panchromatic images are captured at a rate that ensures that the relative movement of the sensor (with respect to the region to be imaged) during an image is less than the width of the smallest spectral filter strip, thereby enabling complete capture of the entire region of interest by the portion of the staring sensor associated with each spectral filter strip. The largest filter by size (either spectral or panchromatic depending upon the embodiment) may have redundant coverage for the area imaged. Redundant image captures may be used in multi-frame enhancement and/or panchromatic sharpening.

Thus, examples of apparatus, methods, and systems for efficient acquisition and processing of high-resolution panchromatic channels (and/or various combinations of high and low resolution multispectral channels) are disclosed herein. Some such example apparatus, methods, and systems can be used for video capture and panchromatic imaging. Using overlapped two-dimensional staring sensors with multiple redundancies in the panchromatic channel, multi-frame enhancement and panchromatic sharpening techniques can be used in various embodiments to provide high-resolution multispectral images without the costs, complexities, or limitations encountered with other sensor systems. Video can be provided from the panchromatic channel in some such embodiments.

Examples of Sensor Structure

The sensor makes up part of an imaging system for overhead imaging. The imaging system moves in a direction of travel, while the sensor captures images. The imaging system may be mounted in or on any kind of overhead imaging platform, for example, an aircraft, an airplane, a helicopter, an unmanned aerial vehicle (UAV), a drone, a satellite, and so forth. The path the imaging platform takes during travel may be referred to as a "track" even though the imaging platform may not literally be attached to a guiding mechanism such as a rail. The area captured by the sensor may be referred to as the region of interest.

The sensor can include a two-dimension staring sensor. FIG. 2 illustrates an example of a two dimensional line staring sensor measurement scanned along a track 101, according to one embodiment. A staring sensor 202 can acquire an entire two-dimensional image frame 203 in a single snapshot. Staring sensors can be configured to capture images in rapid succession. In the example embodiment of FIG. 2, an image is captured sequentially through the capture of many different image frames 204, each of which 203 can have some amount of overlap 205 with the image frames before and/or after it. The imaging region of a staring sensor may be thought of as a two-dimensional surface area. Light can be collected and bundled into individual pixels, whereby the number of pixels relative to the surface area of the image region determines the resolution of the staring sensor. In various embodiments, the staring sensor can comprise a complementary metal-oxide-semiconductor (CMOS) sensor or a charge coupled device (CCD) sensor. The staring sensor can include an array of photodiodes. In some embodiments, the staring sensor includes an active-pixel sensor (APS) comprising an integrated circuit containing an array of pixel sensors. Each pixel sensor can include a photodiode and an active amplifier. For some overhead imaging implementations, the staring sensor (and/or other components of an overhead imaging platform) may be radiation hardened to make it more resistant to damage from ionizing radiation in space.

Staring sensors 202 can be designed such that neighboring images 204 contain overlapping measurements of the region of interest (e.g., the overlap 205). The presence of overlapping regions in the output images allows for later image processing to register neighboring image frames and to mosaic the images together to reconstruct a more accurate image of the region of interest. By generating a mosaic ("mosaicing") of many separate similar images together, the final reconstructed image captured by a staring sensor can correct for deviations in the motion of the imaging platform from the expected direction of travel 101, including deviations in speed and/or direction.

Figure 3:
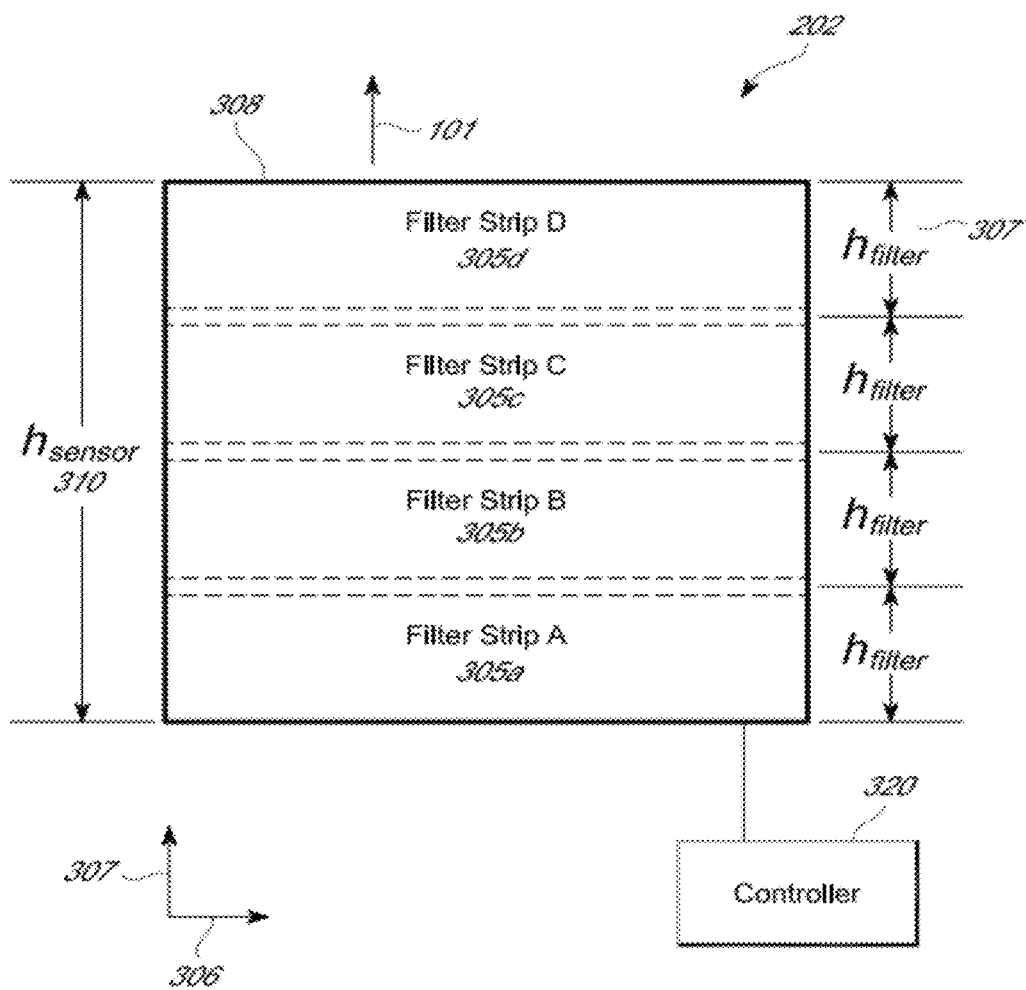
FIG. 3 illustrates an example filter design for a two-dimensional multispectral staring sensor with spectral filter strips, according to one embodiment.

FIG. 3 illustrates an example of a filter design for a two-dimensional multispectral staring sensor 202 that includes spectral filter strips, according to one embodiment. In order to capture multispectral information, the sensor 202 includes a block 308 of a plurality of spectral filter strips 305a-305d. In this example the spectral filter strips 305 are shaped in a long, narrow manner (e.g., strips 305a, 305b, 305c, and 305d) spanning the axis or surface area of the staring sensor 202. The spectral filter strips 305 can be disposed relative to the surface of the staring sensor 202 such that the filter strips 305a-305d are disposed between the surface of the sensor and the region of interest to be captured in an image. The region of interest may include, for example, a portion of the surface of the earth that is to be imaged from an overhead platform. Light from the region of interest can pass through the filter strips 305a-305d before being detected by photosensitive elements of the staring sensor. The strips 305a-305d may be formed over or on the staring sensor or may be attached or bonded to the staring sensor. For example, the strips 305a-305d may be bonded to a ceramic carrier or substrate for the staring sensor.

As shown in FIG. 3, the structure of the staring sensor 202 can be described with reference to two perpendicular axes 306, 307, with the axis 307 in the expected direction of travel 101 of the overhead platform. In this example, the filter strips 305a-305d are oriented perpendicular to the axis 307 in the direction of travel 101. Each strip 305a-305d can have a longitudinal axis (e.g., axis 306a shown for filter strip 305a) that is oriented perpendicular to the axis 307 in the direction of travel 101 of the overhead platform. As will be further described below, each filter strip can have a height h in the direction 307. In some embodiments, the width of the filter strips along the direction 306 (perpendicular to the direction of motion 101) can be substantially the same as the length of the staring sensor in that direction, such that the filter strips substantially cover the surface of the staring sensor 202.

In one example embodiment, the sensor comprises at least four spectral filter strips (e.g., red, green blue, infrared). Other embodiments may have different numbers of strips, for example one, two, three, five, six, seven, or more. The spectral filter strips 305 can be shaped roughly as rectangles (e.g., as shown in FIG. 3) or as parallelograms, squares, polygons, or any other suitable shape. In various embodiments, the filter strips cover substantially the entire surface of the staring sensor.

Each spectral filter strip can be configured to transmit light within a range of wavelengths. For example, a blue spectral filter strip can be configured to transmit wavelengths of light centered around the color blue (e.g., 450-475 nm). Wavelengths of light outside the range transmitted by a filter are blocked, so that light outside the transmitted range is not collected by the pixels of the staring sensor that are "below" the filter strip. The range of wavelengths transmitted by each filter may vary. The range of wavelengths transmitted by a particular filter strip may or may not overlap, at least partially, with the range of wavelengths transmitted by other filter strips, depending upon the embodiment. In addition to red (R), green (G), blue (B), and infrared (IR) filters as illustrated, there are many other possible wavelength ranges that may be transmitted by a spectral filter, for example cyan, yellow, magenta, or orange. Infrared filters can include near, mid, or far infrared filters. Ultraviolet filters can be used. In some implementations, the wavelength ranges (or bandwidths) for the filter strips are selected to cover at least a portion of a desired spectral range, e.g., a visible spectral range, an infrared spectral range, an ultraviolet spectral range, or a combination of such spectral ranges. In some implementations, the spectral range of the filter strips 305a-305d is between about 450 nm to about 900 nm. In some implementations, the filter bandwidths can be less than about 20 nm, less than about 50 nm, less than about 100 nm, less than about 150 nm, less than about 200 nm, or some other range. Additionally, the ordering of spectral filters (as well as placement in relation to a panchromatic sensor, if used) along the direction of relative motion 101 is arbitrary, and as a consequence any order of the filter strips may be used.

In some embodiments, the height 307 of the filter strips along their short edges $h_{filter}$ is between one and four times a minimum filter height. In one embodiment, the minimum filter height is the velocity of the image of a point on the ground as seen on the sensor ($v_{sensor}$) as it moves in the direction of travel 101, divided by the frames per second (or fps) at which the staring sensor 202 (and/or the imaging electronics such as controller 320) is capable of capturing images. In some embodiments, the controller 320 may be integrated with the sensor 202, which may simplify packaging and use with an imaging system. The controller 320 can be used or integrated with any of the embodiments of the sensor 202 described herein to electronically control image or video capture by the sensor 202.

The minimum filter height $h_{min}$ can be expressed as the ratio of the overhead speed of the sensor (relative to the imaging region) to the image capture rate: $v_{sensor}$/fps. Filter strips with heights shorter than $h_{min}$ may not provide sufficient overlap of images, which may make registration difficult. Accordingly, in certain embodiments, the height of a spectral filter ($h_{filter}$) in pixels is greater than or equal to the ratio of the relative rate her, the image moves across the sensor ($v_{sensor}$) in pixels per second, which can be converted into a distance by calculating the size of a pixel and the frame rate (fps):

$$h_{filter} \geq \frac{v_{sensor}}{fps}. \qquad (1)$$

In one example configuration, a minimum filter height ensures that the sensor is able to capture a clear image. The size and layout of the spectral filters 305a-305d are configured to take into account the relative velocity of sensor as it moves along the track direction 101 versus the rate at which the staring sensor 202 can capture images. Filter strips having a height greater than the minimum height $h_{min}$ (given by the right hand side of Equation (1)) helps to provide an adequate overlap between successively captured images of a region of interest that the image can be reconstructed. Adequate overlap between successively captured images includes general overlap between successive images of a region of interest independent of spectral filters. In an embodiment where the spectral filter heights are near the minimum height, one measurement, or image frame, is captured for a region of interest per spectral filter. For example, if there are 4 spectral filters, there will be at least 4 image frames capturing a region of interest, each one capturing light that has passed through a different spectral filter.

The minimum filter height may, in some cases, be a minimum that is feasible with the sensor. In one embodiment, the filter heights can be larger in order to capture more than one measurement per spectral filter for a region of interest. In this embodiment, adequate overlap includes overlap between successive frames captured for a region of interest, where a region of interest is captured by the sensor multiple times with the same spectral filter. In one implementation, the filter height $h_{filter}$ is about 1.25 times the minimum filter height. Other filter heights can be used. For example, the ratio of the filter height to the minimum filter height may be in a range from about 1.0 to 1.2, 1.0 to 1.5, 1.0 to 2.0, 1.5 to 2.5, or some other range.

There is no upper bound on the spectral filter height 307 (other than approximately the physical size of the staring sensor). However, filter heights 307 that are larger than four times the minimum filter height may be undesirable in some implementations due to unnecessary redundancy in the captured image data. For example, in an overhead imaging application, too much redundancy can lead to a large amount of imaging information to transmit to a ground station for processing. Due to the limited transmission bandwidth of some satellites, it may be undesirable to try to transmit too large an amount of imaging information. Accordingly, in some overhead imaging implementations, the filter height $h_{filter}$ may be between about one and four times the minimum height.

The number of filters ($N_{filter}$) that can be disposed on the sensor 202 is the ratio of the height 310 of the sensor ($h_{sensor}$) to the height 307 of the filter ($h_{filter}$):

$$N_{filter} = \frac{h_{sensor}}{h_{filter}}. \qquad (2)$$

Although FIG. 3 illustrates the sensor 202 having filter strips 305a-305d that each have the same height 307, this is for purposes of illustration and is not intended to be limiting. In other implementations, the heights of some or all of the filter strips can be different from each other.

In addition to a two dimensional staring sensor, the sensor optionally may also include a panchromatic block for capturing panchromatic image data in addition to the multispectral image data captured via the filter strips 305a-305d of the staring sensor. The panchromatic block can be sensitive to a wide bandwidth of light as compared to the bandwidth of light transmitted by one or more of the spectral filter strips. For example, the panchromatic block may have a bandwidth that substantially covers at least a substantial portion of the combined bandwidths of the spectral filter strips. In various embodiments, the bandwidth of the panchromatic block may be greater than about 50 nm, greater than about 100 nm, greater than about 250 nm, or greater than about 500 nm. In one implementation, the bandwidth of the panchromatic block is between about 450 nm and about 900 nm. In various implementations, the bandwidth of the panchromatic block can be greater than about two, greater than about three, greater than about four, or greater than about five times the bandwidth of a spectral filter strip.

Figure 4A:
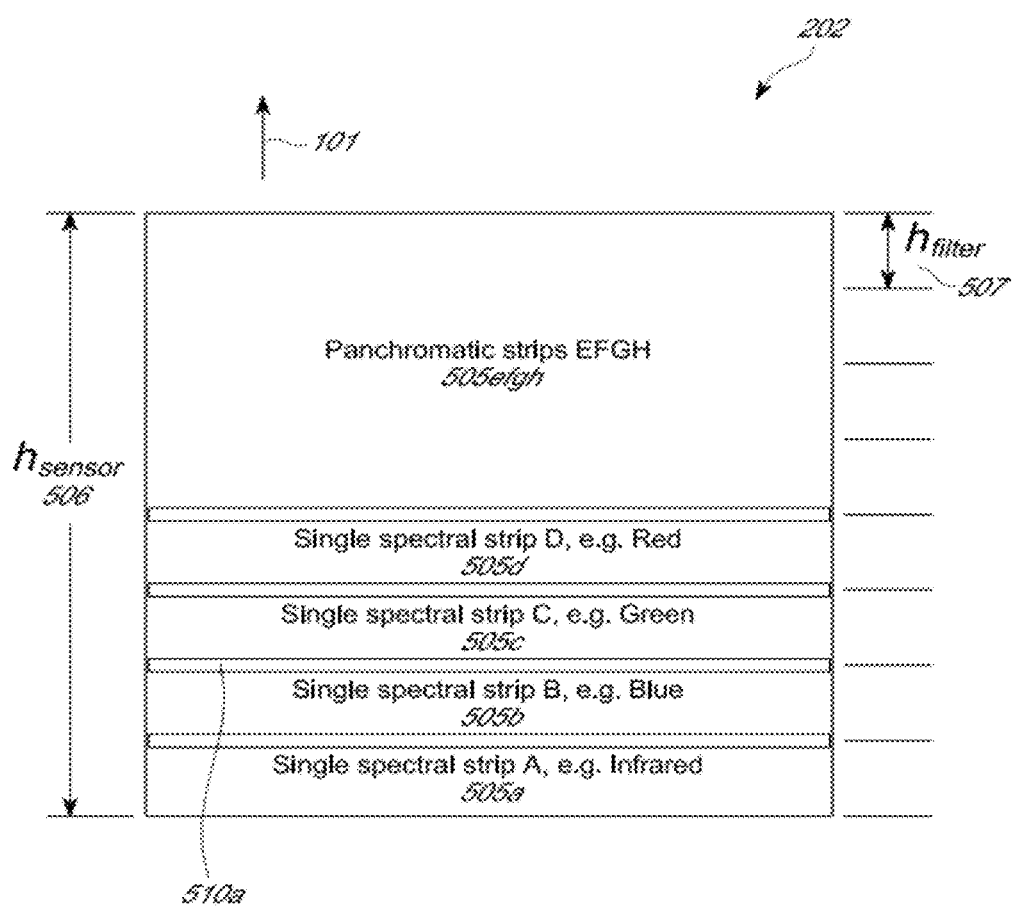
FIG. 4A illustrates an example sensor including a two dimensional staring sensor with spectral filter strips and a panchromatic block, according to one embodiment.

FIG. 4A illustrates an example sensor including a two dimensional staring sensor 202 with spectral filter strips 505a-505d and a panchromatic block 505efgh, according to one embodiment. In the example of FIG. 4A, the panchromatic block (505efgh) is the same width (perpendicular to direction of relative motion 508) as each individual spectral filter strip (e.g., infrared 505a, blue 505b, green 505c, red 505d), but is four times the height 507 (parallel to the direction of motion 101) of any of the individual spectral filter strips 505a-505d. The height of the panchromatic block relative to the height of the spectral filter strips may vary in various implementations. Width and height may be determined based on the direction of relative motion 101 of the overhead platform, where height is parallel to the direction of relative motion 101, and width is perpendicular to the direction of relative motion 101.

In one embodiment, the panchromatic block captures image data at the same resolution as the two dimensional multispectral sensor(s) and filter strips. For example, the panchromatic sensor and the multispectral sensors both may have the same number of pixels and/or size of pixels. In one embodiment, in an overhead imaging application such as an imaging satellite, the resolutions of the multispectral sensors are such that each pixel of the multispectral sensor and panchromatic sensor is able to capture approximately a 1 square meter area on the earth in a single pixel.

FIG. 4A depicts gaps 510 between the spectral filter strips and panchromatic strips, however these gaps may be larger or smaller than depicted, or not included at all depending upon the embodiment of the sensor. The total height 506 of this embodiment of the staring sensor 202 is the sum of the heights of the panchromatic block 505efgh, the spectral strips 505a-505d, and the gaps 510 (if included).

Figure 4B:
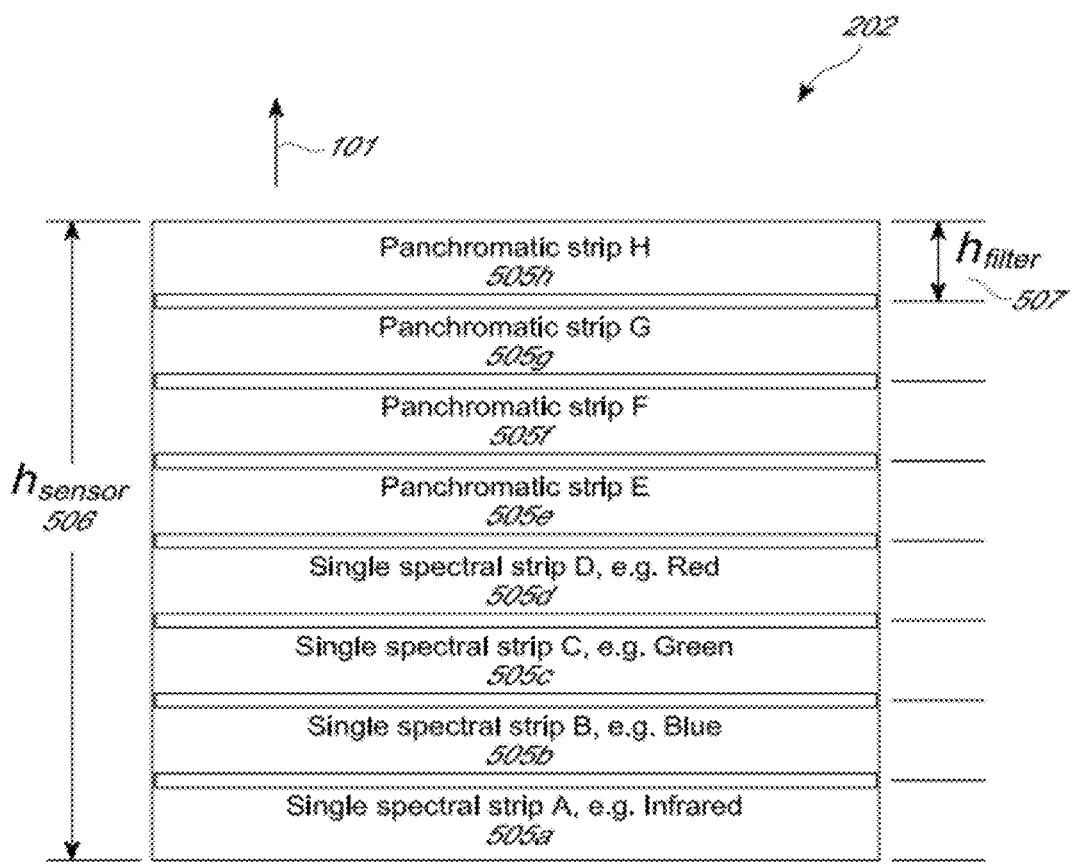
FIG. 4B illustrates an example sensor including a two dimensional staring sensor with spectral filter strips and panchromatic strips, according to one embodiment.

In some embodiments (e.g., FIG. 4A), the panchromatic block 505efgh includes a single panchromatic filter. In other embodiments such as shown in FIG. 4B, the sensor can include a two dimensional multispectral staring sensor with spectral filter strips 505a-505d and a plurality of panchromatic strips 505e-505h. In contrast to the panchromatic block of FIG. 4A, in the example of FIG. 4B panchromatic image data is captured using the plurality of panchromatic strips 505e-505h. The panchromatic image data from multiple panchromatic strips can be combined in a mosaicing process to create full panchromatic images.

Figure 4C:
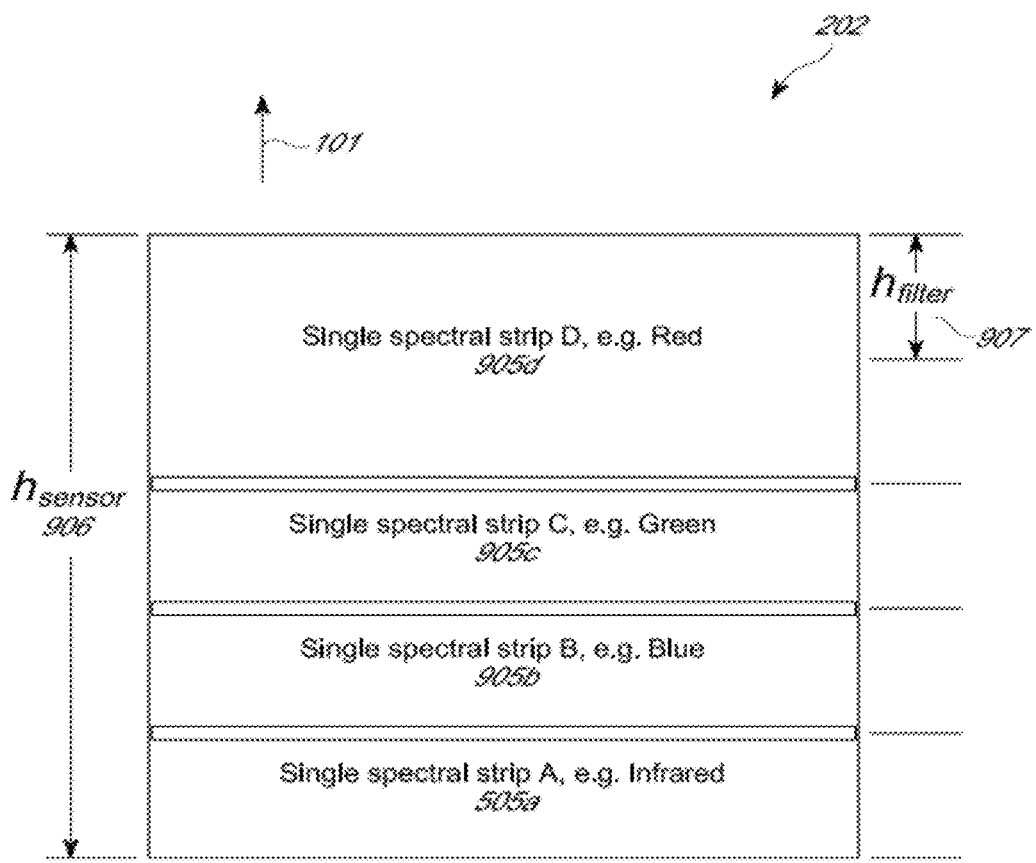
FIG. 4C shows an example sensor where the red spectral strip is twice the size of the other single spectral strips, according to one embodiment.

One or more of the spectral filter strips on the sensor may be enlarged in height relative to the other strips to facilitate multi-frame enhancement during image processing. FIG. 4C shows an example sensor having spectral strips 905a-905d, in which the red spectral filter strip 905d has a height that is twice the height 907 of the other strips 905a-905c. A consequence of enlarging one of the strips (e.g., the red strip) is that the captured spectral image data will have captured additional image frames for a given region of interest for use in a multi-frame enhancement processing. One or more of the spectral strips may be enlarged to different sizes relative to one another, regardless of whether or not a panchromatic sensor is present. The total height 906 of this embodiment of the staring sensor 202 is the sum of the heights of the spectral strips 905a-905d, and any gaps (if included).

Figure 4D:
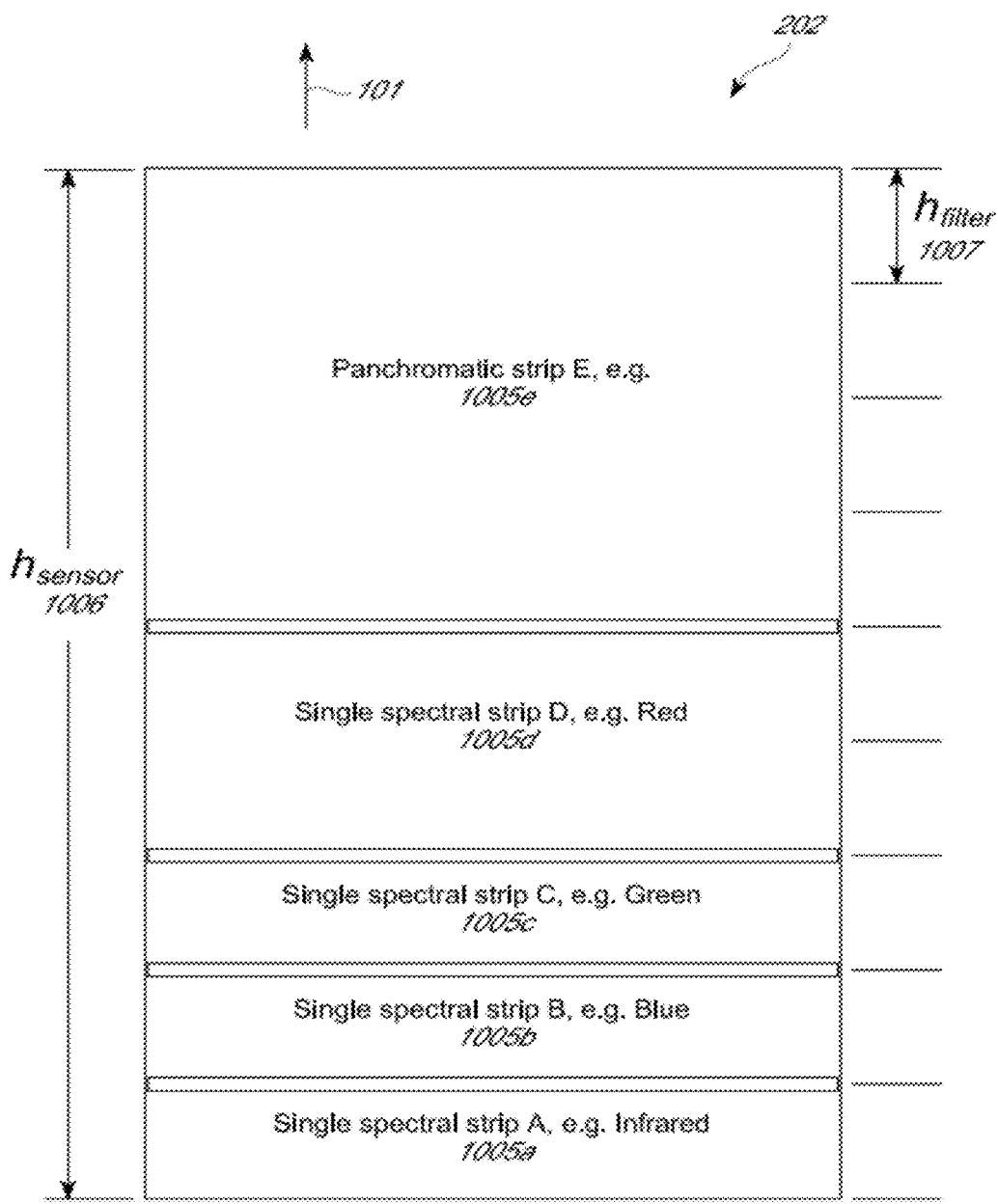
FIG. 4D shows an example sensor including a panchromatic block as well as a red spectral filter strip that is larger than the other spectral strips, according to one embodiment.

FIG. 4D shows an example sensor including a panchromatic block 1005e as well as a spectral filter strip 1005d that is larger than the other spectral strips, according to one embodiment. Although the strip 1005d is shown as red, the color passed by the strip 1005d could be a different color than red (e.g., green or blue) in other embodiments. FIG. 4D shows the panchromatic block 1005e four times the height 1007 of the smallest spectral strip (green, blue, or infrared strips 1005c, 1005b, 1005a, respectively, in this example), and a red spectral strip 1005d two times the height 1007 of the smallest spectral strip. In other embodiments, the relative heights of the spectral filter strips and/or the panchromatic strip(s) can be different from each other and different than shown in the examples illustrated in FIGS. 3 and 4A-4D. In other embodiments, a spectral strip additional or different from the red spectral strip 1005d can have a greater height as compared to the other spectral strips (e.g., the green strip 1005c could have the largest height of the spectral strips 1005a-1005d). The total height 1006 of this embodiment of the staring sensor 202 is the sum of the heights of the panchromatic block 1005e, the spectral strips 1005a-1005d, and any gaps (if included).

In some implementations, all portions of the spectral sensor(s) and panchromatic sensor(s) imaging areas may have the same pixel size, pixel shape, pixel grid or array placement, and/or pixel density. However, in some cases individual portions of the sensors may have differing pixel sizes, shapes, grid or array placements, and/or densities. As long as the individual pixel size, shape, grid, array, and/or density is known, full images can be reconstructed and image processing can be performed. In some implementations, the pixel size, shape, grid or array, and/or pixel density may be different for different portions of the staring sensor. For example, in one implementation, the pixel density is greater for the panchromatic strip(s) than for the spectral strip(s) so that the image spatial resolution of the panchromatic strip(s) is greater than the image spatial resolution of the spectral strip(s).

In both the panchromatic block example and the panchromatic strip example, the images captured overlap in that sequential frames will often capture much of the same image. The amount of overlap depends on the size capture area of the panchromatic portion of the sensor, the distance between the imaging platform and the captured target, and the speed of the imaging platform.

In some embodiments, the sensor includes a single (e.g., monolithic) two-dimensional staring sensor, where different portions of the sensor capture different data based on the spectral filters and/or panchromatic filters. Using a single staring sensor can reduce sensor cost, simplify the manufacture of the sensor, may be easier to implement, and may carry other lifecycle advantages. In other embodiments, multiple staring sensors can be used. For example, the panchromatic strip(s) can be disposed over a first photosensor, and the spectral filter strip(s) can be disposed over a second photosensor. In other implementations, a different photosensor is used for each spectral or panchromatic strip. The different photosensors can, in some cases, have different pixel arrangements. In other embodiments, the staring sensor may be replaced by other types of spectral sensors such as line scanners (including TDI), color wheels, and CFA sensors. In each of these embodiments, the sensor comprises a spectral sensor (e.g., a line scanner), and a panchromatic sensor. Many variations are possible.

The panchromatic portion of the sensor (or panchromatic sensor) can capture images at a relatively high frame rate. As a result, the panchromatic image data captured by the panchromatic block may be used as a panchromatic (e.g., grayscale) video feed with little or no additional processing used. In some implementations, the video can be provided at rates of a few (e.g., about 5) frames per second to about 30 to 50 frames per second. In other implementations, the images captured by the spectral channels (e.g., R, G, B, and IR) can also be provided as one or more spectral video feeds. In some implementations, images from two or more spectral channels can be combined to provide a color video feed (e.g., by combining R, G, and B channels to generate full color video). Further processing may be performed on the panchromatic image data in conjunction with the multispectral image data from the two dimensional staring sensor to create multi-frame enhanced and/or panchromatic-sharpened versions of the captured images. Multiple enhanced and/or sharpened images (panchromatic, spectral, and/or multispectral) can be provided as video or a video stream. In some implementations, at least some of the post-processing of the images from the panchromatic and/or spectral channels is performed on the ground (rather than on the overhead platform) to generate video. The images and/or video may be provided to users (e.g., via download over a network).

Embodiments of the sensor described herein may be used in a number of applications. The sensor may be used as part of an earth-observation imaging system mounted on, for example, an aircraft or satellite. The satellite may be a large or small or a microsatellite or a nanosatellite.

Microsatellite is a broad term and is to be given its ordinary and customary meaning to a person of ordinary skill in the art (e.g., it is not to be limited to a special or customized meaning), and includes, without limitation, satellites with a mass less than or equal to about 500 kg and/or physical dimensions less than or equal to about 125 cm×125 cm×175 cm, or satellites that launch as a secondary payload on a launch vehicle. Microsatellites generally refer to satellites that launch as a secondary payload on a launch vehicle. Microsatellites may be placed in low earth orbit by the launch vehicle (e.g., 1000 km from the surface of the earth). Microsatellites can also be differentiated from larger satellites according to their weight or size. For example, microsatellites may be classified on the basis that their total weight, e.g., on the order of less than 500 kilograms (kg). In another example, microsatellites may be classified on the basis of their size in volume, e.g., on the order of less than 125 centimeters (cm) by 125 cm by 175 cm in volume.

According to some conventions, satellites having a mass less than or equal to about 500 kg are classified as small satellites with further divisions being made based on their mass. For example, in one classification system, small satellites are deemed minisatellites when they have a mass between about 100 kg and 500 kg, microsatellites when they have a mass between about 10 kg and 100 kg, nanosatellites when they have a mass between about 1 kg and 10 kg, picosatellites when they have a mass between about 0.1 kg and 1 kg, and femtosatellites when they have a mass less than or equal to about 100 g. However, any reference to microsatellite, minisatellite, or small satellite in this disclosure should be understood to mean the general class of satellites having a mass less than or equal to about 500 kg and/or physical dimensions less than or equal to about 125 cm×125 cm×175 cm; and not to the more specific classification of satellites identified herein or other similar classification schemes.

Some microsatellites may conform to ESPA standards. ESPA stands for EELV Secondary Payload Adapter, and EELV stands for Evolved Expendable Launch Vehicle, which include, for example, Atlas V and Delta IV launch vehicles. ESPA specifications have been adopted by many in the microsatellite industry as a guideline for determining acceptable microsatellite mass and/or volume for inclusion in launch vehicles. ESPA standards recite a mass envelope of less than or equal to about 180 kg and a volume envelope less than 90 cm×70 cm×60 cm. A microsatellite conforming to these specifications would be suitable for inclusion in a launch vehicle employing an EELV secondary payload adapter. The ESPA standard provides non-limiting examples of envelopes for what constitutes a microsatellite; however, microsatellites configured according to other standards may be suitable for other launch vehicles.

Embodiments of the sensor may be used in a moving vehicle (e.g., a moving automobile) used to capture panoramic views from various positions as the vehicle moves around an area or location. The captured views can be used with a terrestrial mapping or navigation application.

Embodiments of the sensor may also be used for astronomical observation from a fixed ground-based imaging system. The sensor may be used as part of a fixed imaging system observing regular moving objects, for example an assembly line inspection system. The sensor may also be used as part of a fixed imaging system observing irregular moving objects, for example race cars at the finish line of a race (e.g., to provide information for "photo-finishes").

Examples of Image Capture and Processing

The sensor embodiments described above with reference to FIGS. 3-4D advantageously can be used to capture multiple images of a region of interest in spectral and/or panchromatic bands. The images can be processed to reconstruct a full multispectral image of the region. The images can be processed to provide video of the region of interest. In various embodiments, the processing can include one or more of: registration of images, multi-frame enhancement of the images, and/or panchromatic sharpening of the images. A possible advantage of certain embodiments of the sensors disclosed herein is that the layout of the sensor (e.g., multiple spectral strips and a larger panchromatic strip) can enable use of these processing techniques (e.g., registration, multi-frame enhancement, and/or pan-sharpening) to provide enhanced resolution multi-spectral images.

Once images are captured, processing can be performed to reconstruct full multispectral images from the partial images captured through each spectral strip filter covering the multispectral sensor and the panchromatic strip(s), if used. Generally, a sub-image captured by a portion of the multispectral sensor will only have relatively minimal overlap between successive frames. This is typically the case where the spectral filters are near the minimum height, $h_{min}$. Processing allows reconstruction of full multispectral images despite limited overlap between successive frames. The processing can be performed by any suitable hardware processing system. For example, in some overhead implementations, the imaging data acquired by the sensor is transmitted to a receiving station on the ground. The imaging data can be stored (at the ground station or elsewhere), and the imaging data can be processed by a hardware computing system that implements one or more of the methods described herein. In other implementations, some or all of the processing of the imaging data can be performed by a hardware computing system prior to transmission of the data to the ground receiving station (e.g., a computing system on the overhead platform).

In one embodiment, each image frame includes a number of color channel sub-images each captured through a different spectral strip filter. The image data is a measure of the amount of light captured by each pixel in each image. The process of registration, otherwise referred to as "mosaicing", links successive image frames together to form a final reconstructed image. Registration can be based at least in part on the correlation of the image data between the multispectral sub-images and/or the overlap between successive sub-images.

As each multispectral sub-image captures light of different wavelengths, there will generally not be exact correlation in the image data between sub-images of different color channels. However, in many applications, the image data correlates sufficiently between different sub-image color channels to allow cross-color registration between successive image frames of different color channels. This may be possible because spectral filters (e.g., spectral filters 305a-305d, 505a-505d, 905a-905d, 1005a-1005d) typically transmit light within a sufficiently large bandwidth range (e.g., about 50 nm in some implementations) that features in the imaging region appear in some or all of the individual spectral images (as well as the larger bandwidth panchromatic channel, if used). Additionally, for overhead imaging applications, the reflectance spectra of most natural and man-made surface features is strongly correlated, and therefore such features can be detected in some or all of the spectral channels (as well as the panchromatic channel, if used).

For example, a pattern in the image data between pixels that is present in successive image frames may be used to register two frames relative to one another. The pattern may be present in a first sub-image for a first color channel, and a second sub-image of a second color channel. The pattern may also be present in a first sub-image for a first color channel, and again in a second sub-image of the first color channel which at least partially overlaps with the first sub-image in the portion of the image that the pattern is located.

Figure 5B:
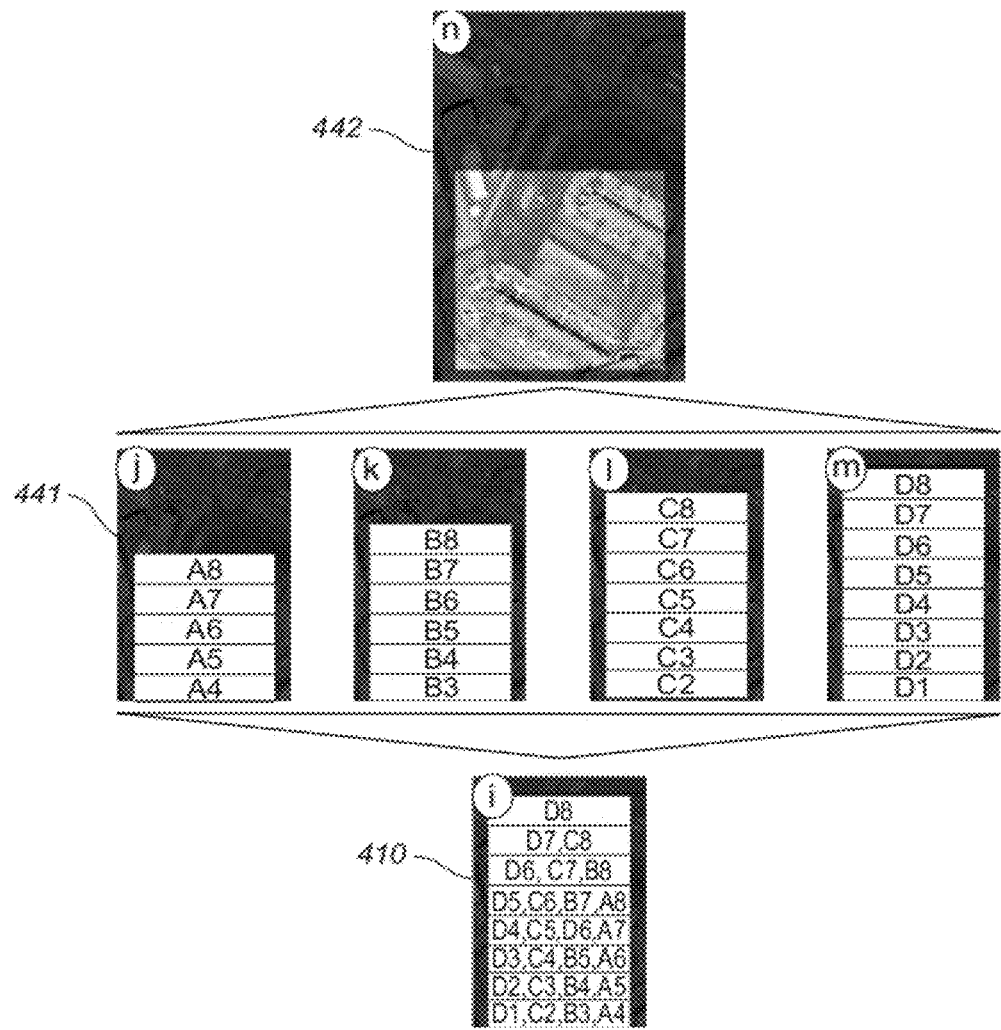

FIG. 5 illustrates an example of an imaging sequence for capturing, registering, and combining an image using a two dimensional multispectral staring sensor with spectral filter strips. As described herein, the sensor 202 moves along the track direction 101, and thus moves relative to a region of interest to be imaged. The sensor captures images successively at a frame rate (frames per second or fps). As the sensor moves and captures image frames, every point in a region of interest is captured at least once by each spectral filter (and/or panchromatic filter). The sensor movement may or may not be aligned with the motion of a moving overhead platform.

In the example embodiment of FIG. 5, images 409a-409h demonstrate a sequence of eight successive frames captured by a sensor scanning over a region of interest. In this example, the sensor used for the imaging is the staring sensor 202 shown in FIG. 3, having spectral filter strips 305a-305d (denoted as filter strips A-D, respectively). In this example, a panchromatic channel is not used. In the example of FIG. 5, the sensor captures an image of a region of interest after eight frame captures, denoted as capture times (CT) 1-8. The individual sensor captures are denoted by a capital letter for the filter strip (from A to D) followed by a number for the capture time. For example, sensor capture D3 in image CT3 represents the capture by the spectral strip D, 305d, in the third capture time.

After collection, all of the images can be co-registered as described above. The co-registered image is represented as image 410i. Once co-registration is completed, a separate reconstructed spectral image can be created for each color (spectral) band. The reconstructed spectral images are represented by images 411j-411m. The reconstructed color band images can be combined to create a multispectral image, represented by image 412n. In some implementations, full color images are generated using only the sub-images from spectral bands B, C, and D (e.g., blue, green, and red).

Figure 6:
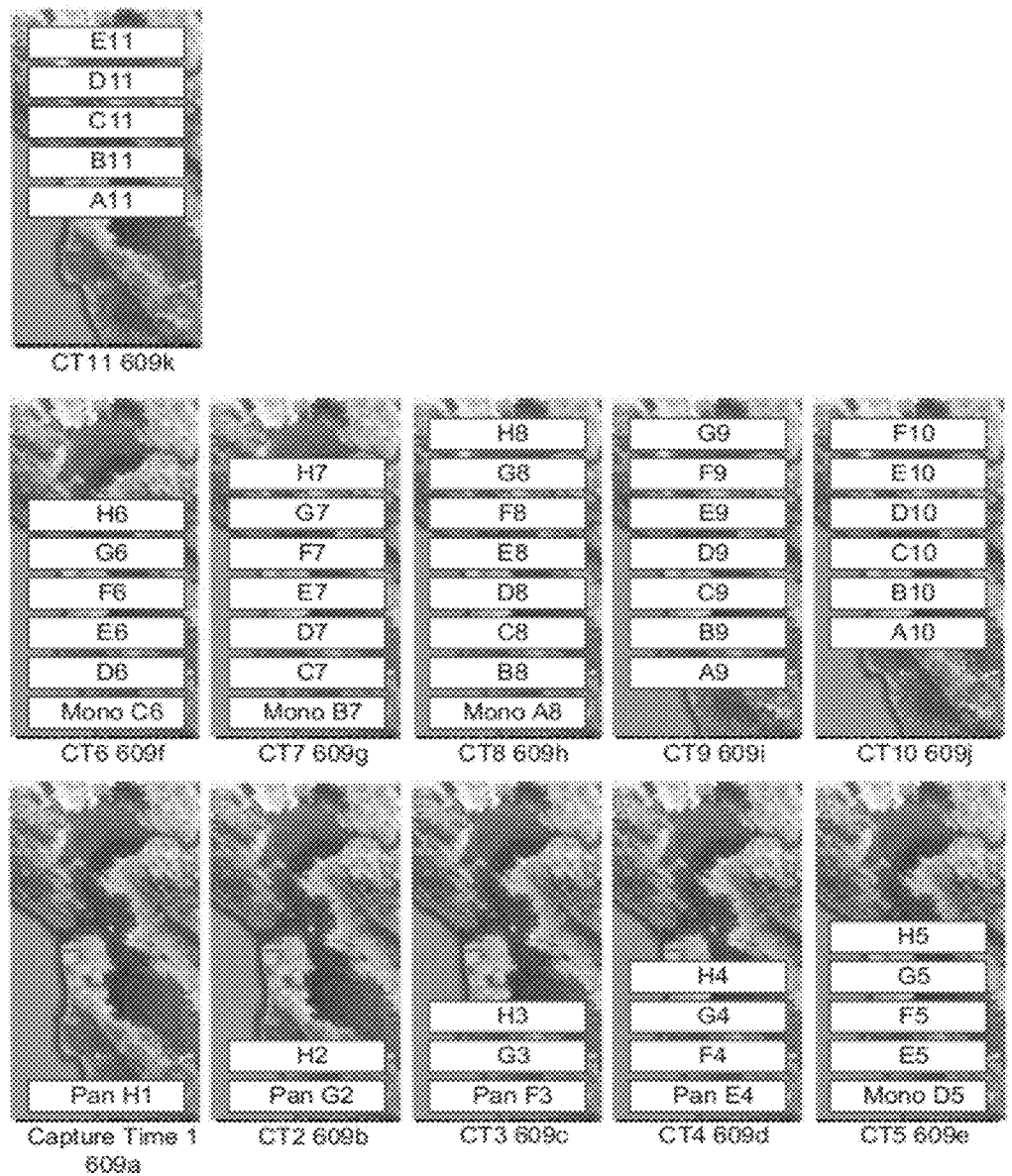
FIG. 6 illustrates an example of an imaging sequence for capturing an image using a sensor including a multispectral sensor and a panchromatic sensor, according to one embodiment.

In cases where the staring sensor includes a panchromatic sensor in addition to the multispectral sensor, captured panchromatic image data may be used to enhance the quality of a multispectral image. FIG. 6 illustrates an example of an imaging sequence for capturing an image using a sensor that includes a multispectral staring sensor and a panchromatic sensor. The example image sequence of FIG. 6 may be captured using the sensor depicted in FIG. 4B, where the sensor includes four spectral strips 505a-505d and four panchromatic strips 505e-505h. In the example of FIG. 6, the sensor captures an image of a region of interest after eleven frame captures, denoted as capture times (CT) 1-11, labeled as 609a-k. The individual sensor captures are denoted by a capital letter for the filter strip (from A to H) followed by a number for the capture time. For example, sensor capture A9 in image CT9, 609i, represents the capture by the spectral strip A, 505a, in the ninth capture time. The terms "Pan" and "Mono" are used in FIG. 6 to indicate that a strip first entering the region of interest is a panchromatic or a color (monochromatic) channel, respectively. In one embodiment, capture in time can be synchronized with the rate and direction of travel.

Figure 7:
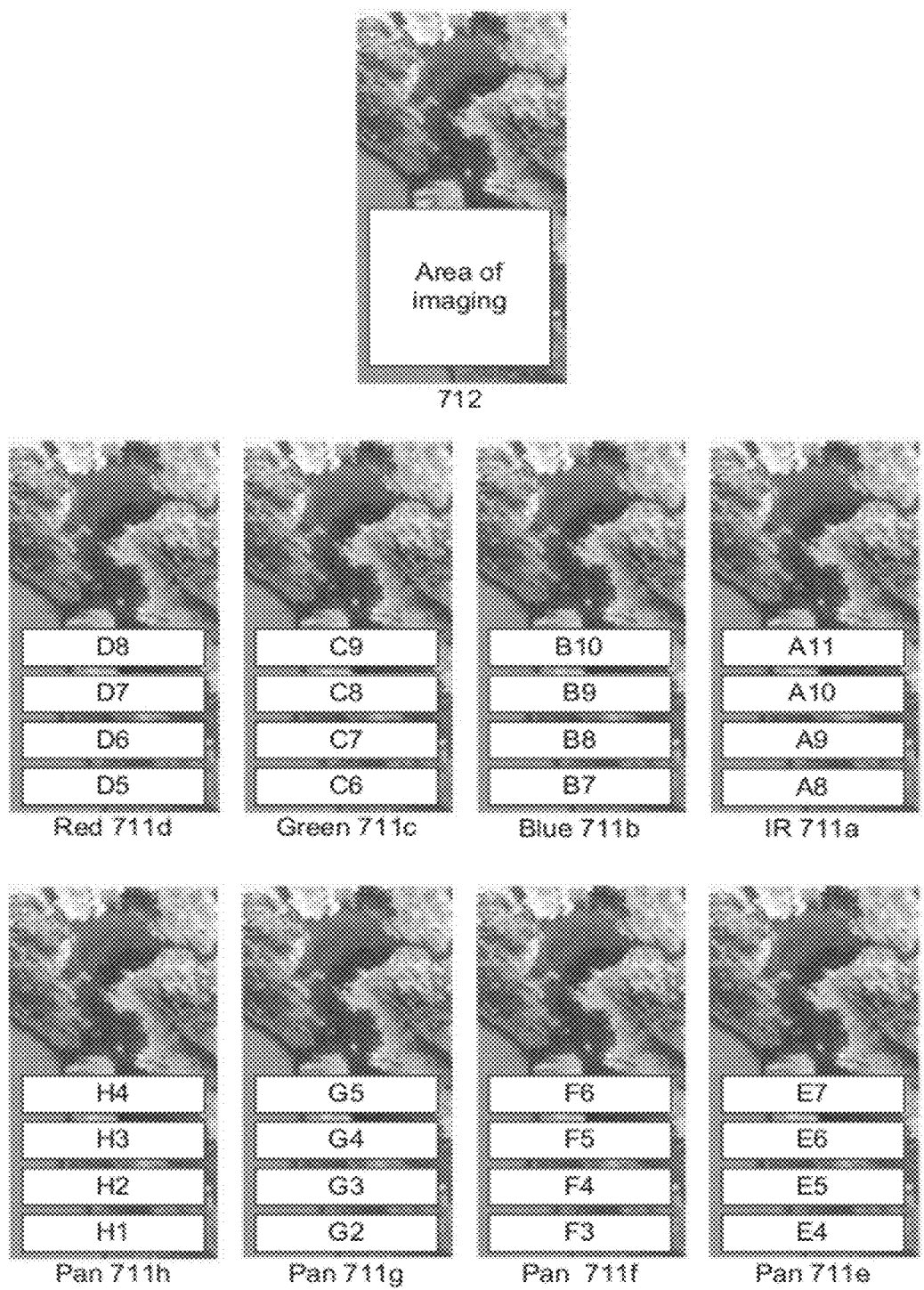
FIG. 7 shows an example of how captured sub-images can be registered and combined to create multispectral images, according to one embodiment.

FIG. 7 shows an example of how captured sub-images can be registered and combined to create multispectral images. In the example of FIG. 7, eight images are reconstructed from the captured sub-images. Four of the reconstructed images are spectral images, Red 711d, Green 711c, Blue 711b, and Infrared 711a. Each spectral image includes image data from a different range of wavelengths in this example (e.g., red, green, blue, and infrared wavelengths). The other four images are panchromatic images, labeled Pan 711e-Pan 711h. The panchromatic images are substantially redundant. All of the images span the area of imaging 712 in this example.

The panchromatic images can be generated differently than shown in FIG. 7. For example, the panchromatic image 711h is shown as generated from the sensor captures H1, H2, H3, and H4. In other embodiments, a panchromatic image could be generated from a different group of frame captures, as long as the group covers the region of interest. For example, a panchromatic image could be generated from captures E4, F4, G4, and H4, or from H1, E5, F5, and G5. In other implementations, this technique can be applied to redundant spectral images that cover a region of interest.

For implementations of the sensor where the panchromatic images (e.g., images 711e-711h) are aligned, multi-frame enhancement processing may be performed to integrate the pixels from the various panchromatic images to form an integrated aligned panchromatic image. Integrating multiple aligned panchromatic images can result in a better signal to noise ratio for the pixels of integrated aligned panchromatic image.

For implementations of the sensor where the panchromatic images are not perfectly aligned, multi-frame enhancement may be performed using the panchromatic images to enhance the reconstructed image. Multi-frame enhancement is also referred to as super resolution. Multi-frame enhancement takes advantage of the fact that slight misalignment between pixels from different panchromatic images causes the obtained panchromatic images to be slightly offset from one another. The misalignment can be a sub-pixel misalignment, meaning that pixels from one image cannot simply be mapped to another pixel in another image. Instead, due to the sub-pixel misalignment, different images will capture an area to be imaged slightly differently, with the difference appearing in the light captured in each pixel by each image. Thus, multiple images of the same area provide additional data which may be used in multi frame enhancement to improve the quality of the multispectral images.

Figure 8:
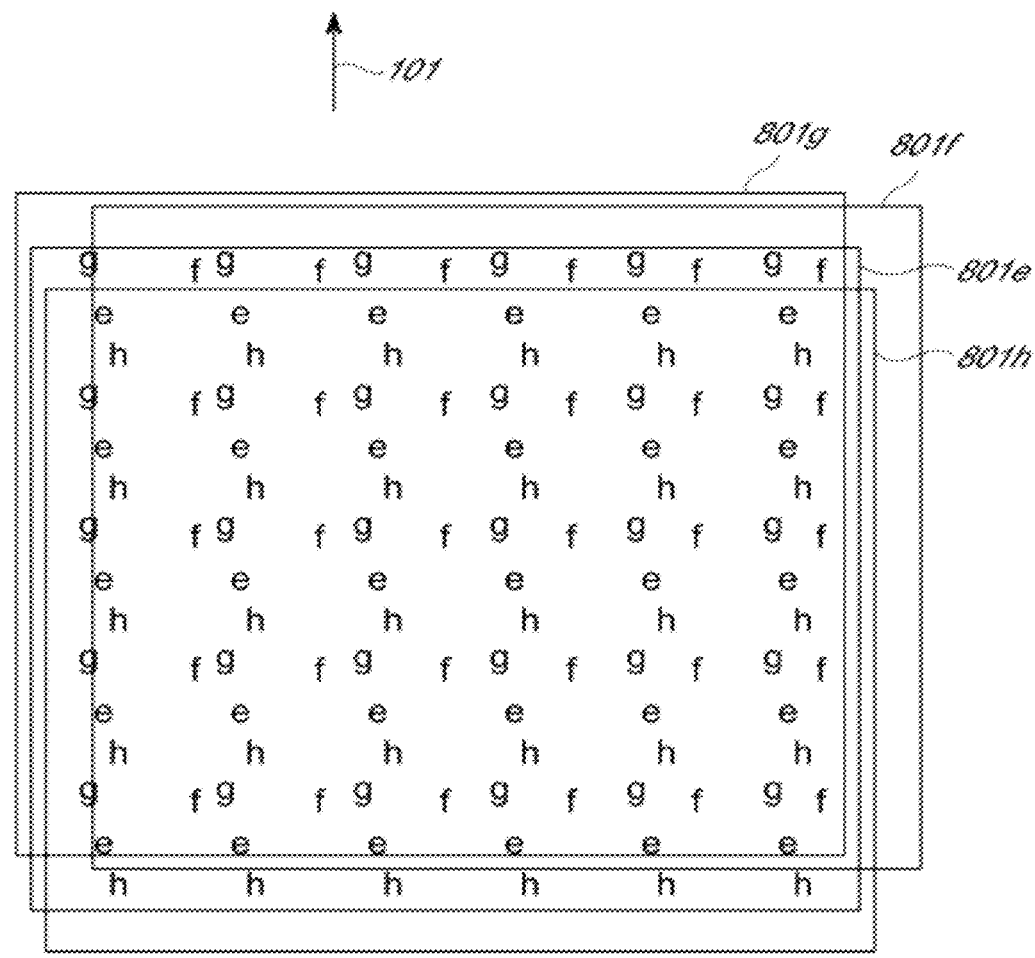
FIG. 8 schematically illustrates an example of subpixel misalignment for pixels captured in multiple images for an example area, according to one embodiment.

FIG. 8 schematically illustrates an example of subpixel misalignment for pixels captured in multiple images for an example area, according to one embodiment. In the example of FIG. 8, four panchromatic images 801e-801h are aligned on a grid. The individual pixels are labeled according to the letter of the image they correspond to, for example, pixels from image 801e are labeled with an "e". The misalignment between images subpixels is visible in the form of the difference of location between the pixels from different images (e.g., the letters "e", "f", "g", and "h" do not lie on top of each other). Subpixel misalignment may be due to randomness in the sensor or another part of the image capture system the sensor is a part of. The noise in an image capture system mounted on an airplane or satellite will generally have randomness not only in the direction of relative motion 101, but also in the orthogonal direction. Subpixel misalignment may also be due to other sources.

Multi-frame enhancement can improve both spatial and pixel fidelity in some cases. Multi-frame enhancement fuses multiple images to produce a higher-resolution enhanced image. Multi-frame enhancement can be applied to multiple panchromatic images such as the redundant panchromatic images 711e-711h shown in FIG. 7. Multi-frame enhancement makes use of subpixel misalignment in the captured panchromatic images to create an enhanced panchromatic image. The enhanced panchromatic image has a higher resolution than the original panchromatic images, and some or all of the aliasing effects present in the original panchromatic images will have been removed in the enhanced panchromatic image. In overhead imaging applications, multi-frame enhancement allows the reconstruction of a panchromatic image with resolvable ground sample distances (GSD) up to the diffraction limit of the optical imaging system. For example, acquiring 5 or more panchromatic images for use in multi-frame enhancement can allow for up to two times (2x) the spatial resolution in both the horizontal and the vertical dimensions relative to the spatial resolution of the originally captured panchromatic images. In some overhead implementations, using about 4, 5, or 6 panchromatic images for the multi-frame enhancement is beneficial because it provides an adequate increase in image resolution without excessively burdening the download data transfer.

In various implementations, embodiments of the methods described in "Advances and Challenges in Super-Resolution," by Sina Farsiu et al., International Journal of Imaging Systems and Technology, pp. 47-57, vol. 14, 2004 (hereinafter, the "Farsiu Paper") can be used for multi-frame enhancement. The Farsiu Paper is incorporated by reference herein in its entirety so as to form a part of this specification.

Enhanced panchromatic images may be used to enhance multispectral images. For example, one or more of the spectral images (or a multispectral image) can be sharpened by using information from the higher resolution multi-frame enhanced panchromatic image. In some implementations, the multi-frame enhanced panchromatic image can be thought of as an input to the pan-sharpening process for increasing the resolution of the images from the spectral filters (or a multi-spectral image). For example, the spectral images can be sharpened by injecting details taken from the higher-resolution multi-frame enhanced panchromatic image.

In some implementations, pan-sharpening can be applied using a data-centric color space wherein the color space conversion of the captured multispectral image frames best matches the panchromatic image frame prior to replacement with that panchromatic image frame. In some applications, the pan-sharpening process can be integrated with the multi-frame enhancement process whereby the method combines both the multiple panchromatic image frames and the multispectral image frames and estimates a higher resolution and quality pan-sharpened image.

In one embodiment, panchromatic enhancement includes converting the multispectral image from its original color system (e.g., RGB) into a luminance, hue, and saturation color system such as HSV, HSL, YCrCb, or YUV, for example. Alternatively, the reconstructed spectral image may be converted into an opponent color system such as International Commission on Illumination (CIE) XYZ, Lab (CIELAB), or Luv (CIELUV), for example. The resulting converted image can be up-sampled to the same resolution as the enhanced panchromatic image. Upsampling may be performed through methods such as replication, b-spline, or bi-cubic interpolation. After upsampling, the luminance data of the image (or its equivalent, depending upon the color system the image was converted to) can be replaced with the enhanced panchromatic image to form an enhanced multispectral image. After enhancement the color conversion process may be reversed to recover individual spectral images from the enhanced multispectral images.

Multispectral images may be processed using panchromatic sharpening (pan-sharpening). Pan-sharpening can be applied where the multispectral image has been converted to a color space where the luminance (or similar) component of the image substantially correlates with a panchromatic image or an enhanced panchromatic image. Pan sharpening can be used to combine the luminance component of the multispectral image with multiple panchromatic images to create a higher resolution pan-sharpened image.

In various implementations, embodiments of the methods described in "Pan-Sharpening of Multispectral Images: A Critical Review and Comparision," by Andrea Garzelli et al., Proc. of IEEE International Geoscience and Remote Sensing Symposium (IGARSS '04), 2004, (hereinafter, the "Garzelli Paper") can be used for panchromatic sharpening. The Garzelli Paper is incorporated by reference herein in its entirety so as to form a part of this specification.

Depending upon the design of the sensor, some spectral filter strips may be larger than others, for example, as illustrated with respect to FIGS. 4C and 4D above. The larger spectral strips may alter the process of multi-frame enhancement in some implementations. The unenlarged sub-images (e.g., green, blue and IR in FIG. 4C) can be up-sampled to the resolution of the enlarged (e.g., red in FIG. 4C) sub-image. The sub-images are registered to create reconstructed spectral images. Similarly to the embodiment of the sensor including a panchromatic sensor, the reconstructed spectral images corresponding to the enlarged spectral filter strip can be based on multiple overlapping captures of the region of interest through the enlarged spectral filter strip. Multi-frame enhancement may be performed on these multiple overlapping spectral images captured through the enlarged strip to create an enhanced spectral image. Accordingly, multi-frame enhancement techniques can be applied to multiple panchromatic images and/or multiple spectral images captured using an enlarged spectral strip.

Similarly as described above, the reconstructed spectral images can be combined into a multispectral image that is converted into another color space. However, in this case the luminance data is not replaced by the enhanced panchromatic image. In one embodiment, no modification is made to the luminance data. In another embodiment, the luminance data is replaced by one of the several overlapping spectral images. In yet another embodiment, the luminance data is replaced with the enhanced spectral image. In one embodiment, the enhanced spectral image is the green spectral image. Replacing the luminance data with the enhanced green spectral image may be advantageous, because the green spectral image corresponds to the channel in the human visual system with the widest frequency response.

In one embodiment, rather than performing multi-frame enhancement on the combined multispectral image, multi-frame enhancement is instead performed on a single reconstructed spectral image. For example, the blue spectral image may be altered with multi-frame enhancement not only to increase spatial fidelity (e.g., resolution), but also to integrate more light into the blue spectral image. Typically, the blue channel is the darkest of the color channels, and thus the addition of light can improve image quality. Multi-frame enhancement may be performed on any spectral image, for example, the red, green, or infrared images.

Multi-frame enhancement and pan sharpening may be combined to reduce the overall computation, memory access, and workspace memory required to process images. This may be accomplished, for example, by processing the panchromatic and spectral images separately for each band. By processing bands rather than full images, the processing and memory requirements of processing are reduced. In this embodiment, registration is performed near the end of image processing rather than near the beginning. Additionally, certain mathematical methods can be combined to reduce the number of computational cycles required.

Figure 9:
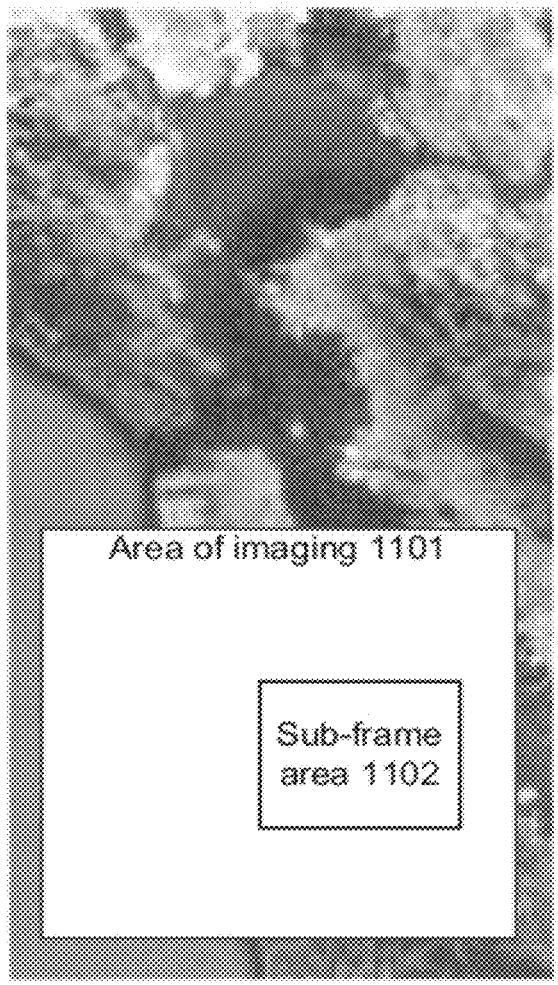
FIG. 9 shows an example of a sub-frame area that is processed with multi-frame and/or pan sharpening enhancement, while the remainder of the image is not processed with multi-frame and/or pan sharpening, according to one embodiment.

Multi-frame enhancement and/or pan sharpening may be applied to only a portion (e.g., a sub-frame area) of an image. FIG. 9 shows an example of a sub-frame area 1102 that is processed with multi-frame and/or pan-sharpening enhancement, while the remainder of the image (or area of imaging) 1101 is not processed, according to one embodiment. These sub-image areas may be referred to as regions-of-interest (ROI). The decision to perform enhancement on the entire image or just a sub-image area, as well as the selection of the sub-image area may be determined, for example, by the needs of the user.

Figure 10:
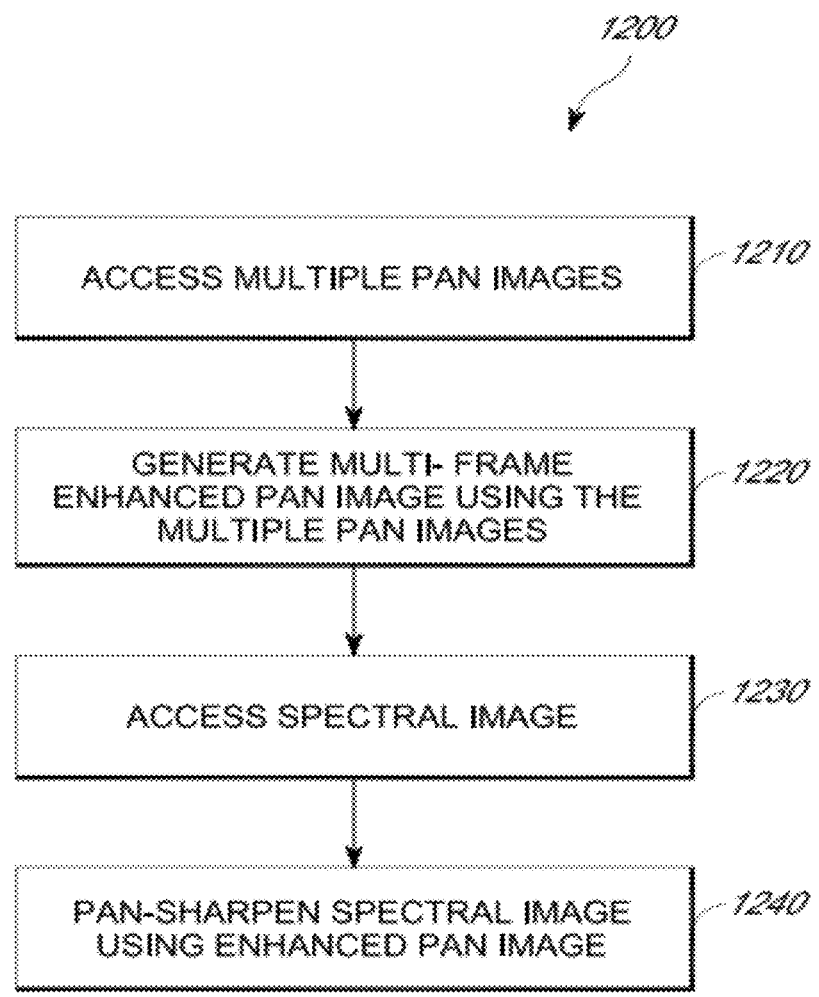
FIG. 10 is a flowchart that illustrates an example of a method for enhancing images using multi-frame enhancement and/or panchromatic sharpening techniques.

FIG. 10 is a flowchart that illustrates an example of a method 1200 for enhancing images using multi-frame enhancement and/or panchromatic sharpening. The images can be acquired using any of the embodiments of the sensor 202 described herein. The method 1200 can be applied to entire images or to a sub-frame area 1102 of the image. The method 1200 may be performed by an image processing computer system comprising computer hardware on images containing thousands (or more) pixels. In some implementations, the images are acquired by an overhead imaging system and transmitted to the ground (e.g., via a radio-frequency (RF) communications link), and the method 1200 is performed by a ground-based image processing system.

At block 1210 of the example method 1200, multiple panchromatic images of an ROI are accessed (e.g., from a datastore). In various embodiments, 2, 3, 4, 5, 6, or more panchromatic images are accessed. At block 1220, multi-frame enhancement techniques (e.g., super resolution) are used to generate a multi-frame enhanced panchromatic image based at least in part on the multiple panchromatic images. The enhanced panchromatic image can have a resolution greater than the individual panchromatic images. For example, in some implementations 4 to 6 panchromatic images are accessed to generate an enhanced panchromatic image with a resolution up to the diffraction limit of the optical imaging system used to acquire the individual panchromatic images. The enhanced panchromatic image can be stored in a suitable datastore or otherwise provided to a user. Accordingly, in some embodiments, an enhanced panchromatic image can be provided that has a spatial resolution greater than the spatial resolution of the panchromatic channel of the sensor 202. Although the method 1200 illustrates multi-frame enhancement for panchromatic images, the method 1200 may be applied to spectral or multi-spectral images to generate enhanced (e.g., super-resolved) spectral or multispectral images.

In some implementations, the method 1200 further continues at blocks 1230 and 1240 to pan-sharpen spectral (or multispectral) images. At block 1230, one or more spectral images is accessed (e.g., from a datastore). The spectral images can correspond to particular color bandwidths (e.g., R, G, B, IR) and may be acquired from embodiments of the sensor 202 described herein. As described herein, the spectral image typically will have a spatial resolution (in at least one direction) that is lower than the spatial resolution of the enhanced panchromatic image. At block 1240, a pan-sharpened spectral (or multispectral) image is generated based at least in part on the multi-frame enhanced panchromatic image generated at block 1220. For example, the spectral images can be sharpened by injecting details taken from the higher-resolution multi-frame enhanced panchromatic image. Accordingly, in some embodiments, a pan-sharpened spectral or multispectral (e.g., color) image can be provided that has a spatial resolution greater than the spatial resolution of spectral (and/or panchromatic) channels of the sensor 202.

Figure 11:
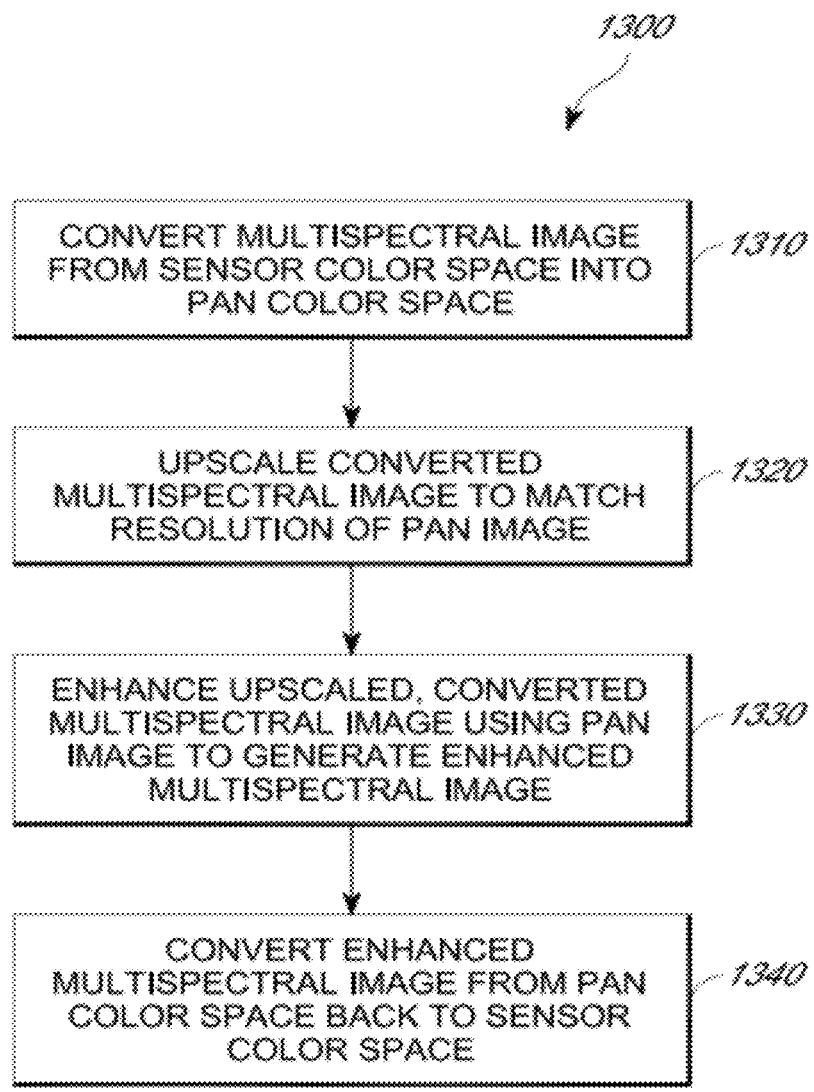
FIG. 11 is a flowchart that illustrates an example of a method for panchromatic sharpening of multispectral images.

FIG. 11 is a flowchart that illustrates an example of a method 1300 for panchromatic sharpening of multispectral images. The images can be acquired using any of the embodiments of the sensor 202 described herein. The method 1300 can be applied to entire images or to a sub-frame area 1102 of the image. The method 1300 may be performed by an image processing computer system comprising computer hardware on images containing thousands (or more) pixels. In some implementations, the images are acquired by an overhead imaging system and transmitted to the ground (e.g., via a radio-frequency (RF) communications link), and the method 1300 is performed by a ground-based image processing system.

At block 1310 of the example method 1300, a multispectral image is converted from its original color space (e.g., the color space of the sensor that acquires the multispectral image data) into a pan color space associated with the panchromatic image used for the pan-sharpening. The panchromatic image can be a higher resolution pan image or a multi-frame enhanced pan image. The pan color space can be, for example, a luminance, hue, and saturation color system such as HSV, HSL, YCrCb, or YUV, or a CIE color space such as CIEXYZ, CIELAB, or CIELUV. The pan color space can be a good match to the color space of the panchromatic image used for the sharpening. For example, in some embodiments, the pan color space is such that the luminance (or similar) component of the multispectral image substantially correlates with the panchromatic image used for pan-sharpening. Block 1310 is optional and color conversion is not used in certain embodiments (block 1340 is also not used in such embodiments).

At block 1320, the color-space converted multispectral image is upscaled in spatial resolution to match the higher spatial resolution panchromatic image. At block 1330, a pan-sharpening technique can be applied to sharpen the multispectral image. For example, as described herein, luminance data of the multispectral image can be replaced with the panchromatic image to form an enhanced multispectral image. At block 1340, the enhanced multispectral image can be converted back into the original color space of the multispectral image (if desired).

Although the example method 1300 has been described with reference to multispectral and panchromatic images, this is for purpose of illustration and not limitation. In other embodiments, the method 1300 can be used to pan-sharpen spectral images using a higher resolution spectral image. For example, the embodiment of the sensor 202 shown in FIGS. 4C and 4D has a spectral channel (in this case, red) that is twice the height of the other spectral channels (blue, green, and IR) and can be used to generate multiple spectral images that can be multi-frame enhanced and used for pan-sharpening the other spectral channels.

Additional Considerations

Each of the processes, methods, and algorithms described in the preceding sections may be embodied in, and fully or partially automated by, code modules executed by one or more computers, computer systems, computer processors, machines, or hardware configured to execute computer instructions. The code modules may be stored on any type of non-transitory computer-readable medium or hardware computer storage device, such as hard drives, solid state memory, RAM, ROM, optical disc, and/or the like. The systems and modules may also be transmitted as generated data signals (e.g., as part of a carrier wave or other analog or digital propagated signal) on a variety of computer-readable transmission mediums, including wireless-based and wired/cable-based mediums, and may take a variety of forms (e.g., as part of a single or multiplexed analog signal, or as multiple discrete digital packets or frames). The methods, processes, and algorithms may be implemented partially or wholly in application-specific circuitry, special purpose hardware, or a general purpose hardware computer system programmed to perform the methods, processes, or algorithms pursuant to instructions from program software. The results of the disclosed processes and process steps may be stored, persistently or otherwise, in any type of non-transitory, tangible computer storage such as, e.g., volatile or non-volatile storage.

The various features and processes described above may be used independently of one another, or may be combined in various ways. All possible combinations and subcombinations are intended to fall within the scope of this disclosure. Nothing in the foregoing description is intended to imply that any particular feature, element, characteristic, step, module, method, process, or block is necessary or indispensable. In addition, certain features, elements, characteristics, methods, processes, modules, steps, or blocks, may be omitted in some implementations. The methods and processes described herein are also not limited to any particular sequence, and the blocks or states relating thereto can be performed in other sequences that are appropriate. The example systems and components described herein may be configured differently than described. For example, elements may be added to, removed from, or rearranged compared to the disclosed example embodiments.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

As used herein, the terms "comprises," "comprising," "includes," "including," "has," "having" or any other variation thereof, are intended to cover open-ended, non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present). In addition, use of the "a" or "an" are employed to describe elements and components of the embodiments herein. This is done merely for convenience and to give a general sense of the inventions. This description should be read to include one or at least one and the singular also includes the plural unless it is obvious that it is meant otherwise.

While particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope of the disclosure. The foregoing description, for purpose of explanation, has been described with reference to specific embodiments. However, the illustrative discussions above are not intended to be exhaustive or to limit the inventions to the precise forms disclosed. Many modifications and variations are possible in view of the above teachings. The embodiments were chosen and described in order to explain the principles of the inventions and their practical applications, to thereby enable others skilled in the art to utilize the inventions and various embodiments with various modifications as are suited to the particular use contemplated.

What is claimed is:

1. A computer-implemented method of enhancing image data, the method comprising:

receiving, by one or more computing devices, a sequence of spectral image strips, each spectral image strip comprising an image of a portion of a region of interest, each spectral image strip comprising image data from a spectral range of wavelengths of light, wherein each spectral image strip contains overlapping measurements of the region of interest relative to one or more neighboring spectral image strips;

registering, by the one or more computing devices, the sequence of spectral image strips to provide a spectral image of the region of interest based at least in part on the overlapping measurements of the region of interest;

receiving, by the one or more computing devices, a plurality of panchromatic images of the region of interest, each panchromatic image comprising image data from a panchromatic range of wavelengths of light that is broader than the spectral range of wavelengths of light;

performing, by the one or more computing devices, multi-frame enhancement on the plurality of panchromatic images to generate an enhanced panchromatic image having a higher resolution than each of the plurality of panchromatic images; and generating, by the one or more computing devices, a panchromatic-sharpened spectral image using at least the enhanced panchromatic image and the spectral image, the panchromatic-sharpened spectral image having a higher resolution than the spectral image;

wherein each spectral image strip and each panchromatic image is captured by a single sensor device.

2. The method of claim 1, wherein receiving a sequence of spectral image strips comprises:
receiving, by the one or more computing devices, a first sequence of spectral image strips comprising image data from a first spectral range of wavelengths of light;
receiving, by the one or more computing devices, a second sequence of spectral image strips comprising image data from a second spectral range of wavelengths of light, the second spectral range different from the first spectral range; and
registering the sequence of spectral image strips comprises:
registering, by the one or more computing devices, the first sequence of spectral image strips to provide a first spectral image of the region of interest; and
registering, by the one or more computing devices, the second sequence of spectral image strips to provide a second spectral image of the region of interest.

3. The method of claim 2, further comprising combining, by the one or more computing devices, the first spectral image and the second spectral image to generate a multi-spectral image of the region of interest.

4. The method of claim 1, further comprising upsampling, by the one or more computing devices, the spectral image to the resolution of the enhanced panchromatic image.

5. The method of claim 1, wherein the plurality of panchromatic images and the spectral image have a substantially similar capture resolution.

6. The method of claim 1, wherein generating the panchromatic-sharpened spectral image comprises:
converting the spectral image into a color system comprising a luminance component to create a converted spectral image; and
replacing the luminance component of the converted spectral image with the enhanced panchromatic image.

7. The method of claim 6, further comprising converting, by the one or more computing devices, back into a color system of the spectral image after replacing the luminance component of the converted spectral image with the enhanced panchromatic image.

8. The method of claim 1, wherein receiving the plurality of panchromatic images comprises receiving at least four panchromatic images.

9. The method of claim 1, wherein the plurality of panchromatic images are captured by an imaging system having a diffraction limit, and receiving the plurality of panchromatic images comprises receiving sufficient panchromatic images such that the enhanced panchromatic image has a resolution of approximately the diffraction limit of the imaging system.

10. The method of claim 1, wherein generating the panchromatic-sharpened spectral image comprises injecting details from the enhanced panchromatic image into the spectral image.

11. The method of claim 1, wherein
performing multi-frame enhancement comprises performing multi-frame enhancement on only a sub-frame area of the panchromatic images to generate an enhanced panchromatic image of the sub-frame area; and
generating the panchromatic-sharpened spectral image comprises generating the panchromatic-sharpened spectral image of only the sub-frame area.

* * * * *